(12) United States Patent
Odar et al.

(10) Patent No.: US 7,901,191 B1
(45) Date of Patent: Mar. 8, 2011

(54) ENCLOSURE WITH FLUID INDUCEMENT CHAMBER

(75) Inventors: Andrew M. Odar, Chardon, OH (US); Rex J. Harvey, Mentor, OH (US); Michael A. Benjamin, Shaker Heights, OH (US); Peter V. Buca, Parma Heights, OH (US)

(73) Assignee: Parker Hannifin Corporation, Cleveland, OH (US)

( * ) Notice: Subject to any disclaimer, the term of this patent is extended or adjusted under 35 U.S.C. 154(b) by 366 days.

(21) Appl. No.: 11/400,778

(22) Filed: Apr. 7, 2006

Related U.S. Application Data

(60) Provisional application No. 60/669,260, filed on Apr. 7, 2005, provisional application No. 60/674,032, filed on Apr. 22, 2005.

(51) Int. Cl.
*E21B 43/12* (2006.01)
*H05K 7/20* (2006.01)

(52) U.S. Cl. ............ 417/65; 417/77; 417/151; 165/80.4; 361/679.53; 361/698

(58) Field of Classification Search .................. 417/65, 417/151, 77, 313; 361/699, 679.53, 688, 361/689, 698; 165/80.4
See application file for complete search history.

(56) References Cited

U.S. PATENT DOCUMENTS

| 86,152 | A | 1/1869 | Hancock |
|---|---|---|---|
| 137,507 | A | 4/1873 | Thayer |
| 250,073 | A | 11/1881 | Hudson |
| 368,691 | A | 8/1887 | See |
| 436,932 | A | 9/1890 | Best |
| 550,244 | A | 11/1895 | Blagburn |
| 607,849 | A | 7/1898 | Hampson |
| 640,483 | A | 1/1900 | Gildea |
| 694,002 | A | 2/1902 | Davis |
| 900,814 | A | 10/1908 | Wilson |
| 1,327,294 | A | 1/1920 | Scanes |
| 1,484,345 | A | 2/1924 | Stoelting |
| 2,044,088 | A | 6/1936 | Lord |
| 2,191,424 | A | 2/1940 | Cardinal |
| 2,196,859 | A | 4/1940 | Godfrey |
| 2,452,421 | A | 10/1948 | Ames |
| 2,524,703 | A | 10/1950 | Hartman |
| 2,616,614 | A | 11/1952 | Plummer, Jr. |

(Continued)

FOREIGN PATENT DOCUMENTS

EP 178 873 12/1988

(Continued)

*Primary Examiner* — Devon C Kramer
*Assistant Examiner* — Leonard J Weinstein
(74) *Attorney, Agent, or Firm* — Renner, Otto, Boisselle & Sklar, LLP

(57) ABSTRACT

An enclosure (100) comprising a wall structure (110) defining a container space (112) and electronic devices (114) contained within this space (112). The wall structure (110) includes an entrance for providing an operative fluid (e.g., a heat-transfer fluid) into the container space (112) and an exit for draining the operative fluid therefrom. The wall structure (110) includes an inducement chamber that, when a motive fluid is introduced through an inlet (120), produces a differential pressure that induces the operative fluid in the container space (112) to flow through the exit to an outlet (122). The wall structure (110) can be at least partially constructed from a stack (400) of plates having openings and grooves forming the inlet, the outlet, the entrance, the exit, the fluid circuits, and the chambers.

10 Claims, 21 Drawing Sheets

U.S. PATENT DOCUMENTS

| | | | |
|---|---|---|---|
| 2,632,597 A | 3/1953 | Boeckeler | 230/92 |
| 2,702,664 A | 2/1955 | Pienaar | |
| 3,247,860 A | 4/1966 | Zilberfarb | 137/81.5 |
| 3,285,265 A | 11/1966 | Boothe et al. | 137/81.5 |
| 3,442,280 A | 5/1969 | Boothe | 137/81.5 |
| 3,589,382 A | 6/1971 | Glass | 137/81.5 |
| 3,877,238 A | 4/1975 | Chang et al. | 61/72.4 |
| 3,922,112 A | 11/1975 | Miscovich | 417/54 |
| 4,165,571 A | 8/1979 | Chang et al. | 37/62 |
| 4,186,772 A | 2/1980 | Handleman | 137/604 |
| 4,316,680 A | 2/1982 | Phipps et al. | 406/49 |
| 4,531,592 A | 7/1985 | Hayatdavoudi | 175/67 |
| 4,681,372 A | 7/1987 | McClure | 299/8 |
| 4,716,936 A | 1/1988 | Mon et al. | 137/833 |
| 4,833,880 A | 5/1989 | Chapin | 60/39.281 |
| 4,867,877 A | 9/1989 | Hansen et al. | 210/257.1 |
| 5,012,984 A | 5/1991 | Ishikawa et al. | 241/16 |
| 5,021,924 A | 6/1991 | Kieda et al. | 361/385 |
| 5,131,233 A | 7/1992 | Cray et al. | 62/64 |
| 5,182,017 A | 1/1993 | Ippendorf | 210/225 |
| 5,220,804 A | 6/1993 | Tilton et al. | 62/64 |
| 5,260,850 A * | 11/1993 | Sherwood et al. | 361/689 |
| 5,285,351 A | 2/1994 | Ikeda | 361/699 |
| 5,435,884 A | 7/1995 | Simmons et al. | 216/100 |
| 5,478,209 A | 12/1995 | McDonough | 417/174 |
| 5,522,419 A | 6/1996 | Sand | 137/216 |
| 5,628,623 A | 5/1997 | Skaggs | 417/151 |
| 5,667,365 A | 9/1997 | Miller et al. | 417/151 |
| 5,675,473 A | 10/1997 | McDunn et al. | 361/699 |
| 5,687,577 A | 11/1997 | Ballard et al. | 62/64 |
| 5,718,117 A | 2/1998 | McDunn et al. | 62/64 |
| 5,719,444 A | 2/1998 | Tilton et al. | 257/714 |
| 5,731,542 A | 3/1998 | Limper-Brenner et al. | 174/52.4 |
| 5,740,967 A | 4/1998 | Simmons et al. | 239/494 |
| 5,761,035 A | 6/1998 | Beise | 361/699 |
| 5,768,103 A | 6/1998 | Kobrinetz et al. | 361/699 |
| 5,787,865 A | 8/1998 | Harris et al. | 123/516 |
| 5,810,563 A | 9/1998 | Volkmann | 417/174 |
| 5,811,013 A | 9/1998 | Ito | 210/705 |
| 5,818,692 A | 10/1998 | Denney, Jr. et al. | 361/699 |
| 5,831,824 A | 11/1998 | McDunn et al. | 361/699 |
| 5,860,602 A | 1/1999 | Tilton et al. | 239/548 |
| 5,880,931 A | 3/1999 | Tilton et al. | 361/690 |
| 5,938,408 A | 8/1999 | Krichbaum | 417/87 |
| 5,957,665 A | 9/1999 | Kanzler et al. | 417/55 |
| 5,982,616 A * | 11/1999 | Moore | 361/679.47 |
| 5,993,167 A | 11/1999 | Mochizuki | 417/174 |
| 6,016,969 A | 1/2000 | Tilton et al. | 239/1 |
| 6,017,195 A | 1/2000 | Skaggs | 417/181 |
| 6,052,284 A | 4/2000 | Suga et al. | 361/699 |
| 6,108,201 A | 8/2000 | Tilton et al. | 361/689 |
| 6,119,902 A | 9/2000 | Shimada et al. | 222/321.3 |
| 6,162,021 A | 12/2000 | Sarshar et al. | 417/174 |
| 6,171,069 B1 | 1/2001 | Levitin et al. | 417/187 |
| 6,210,123 B1 | 4/2001 | Wittrisch | 417/194 |
| 6,244,827 B1 | 6/2001 | Popov et al. | 417/88 |
| 6,248,154 B1 | 6/2001 | Popov | 95/156 |
| 6,251,167 B1 | 6/2001 | Berson | 95/263 |
| 6,302,655 B1 | 10/2001 | Popov | 417/77 |
| 6,322,327 B1 | 11/2001 | Dawson et al. | 417/198 |
| 6,349,554 B2 | 2/2002 | Patel et al. | 62/259.2 |
| 6,354,371 B1 | 3/2002 | O'Blanc | 166/69 |
| 6,364,624 B1 | 4/2002 | Popov | 417/54 |
| 6,377,453 B1 | 4/2002 | Belady | 361/687 |
| 6,395,167 B1 | 5/2002 | Mattson, Jr. et al. | 210/169 |
| 6,418,957 B1 | 7/2002 | Goodyear | 137/14 |
| 6,450,775 B1 | 9/2002 | Hutchinson et al. | 417/198 |
| 6,498,725 B2 | 12/2002 | Cole et al. | 361/700 |
| 6,575,705 B2 | 6/2003 | Akiyama et al. | 417/198 |
| 6,625,023 B1 | 9/2003 | Morrow et al. | 361/700 |
| 6,688,137 B1 | 2/2004 | Gupte | 62/515 |
| 6,698,475 B2 | 3/2004 | Schaefer et al. | 141/325 |
| 6,702,156 B2 | 3/2004 | Shimada et al. | 222/321.7 |
| 6,712,590 B1 | 3/2004 | Villela et al. | 417/423.9 |
| 6,732,700 B2 | 5/2004 | Suganuma | 123/196 |
| 6,817,837 B2 | 11/2004 | Hutchinson et al. | 417/77 |
| 6,852,511 B2 | 2/2005 | Romano et al. | 435/69.1 |
| 6,857,920 B2 | 2/2005 | Marathe et al. | 440/38 |
| 6,863,084 B2 | 3/2005 | Achoff | 137/565.22 |
| 6,955,062 B2 | 10/2005 | Tilton et al. | 62/259.2 |
| 6,994,151 B2 * | 2/2006 | Zhou et al. | 165/80.4 |
| 7,104,078 B2 | 9/2006 | Tilton | |
| 7,114,550 B2 * | 10/2006 | Nakahama et al. | 165/80.4 |
| 7,150,109 B2 | 12/2006 | Knight et al. | |
| 7,299,647 B2 | 11/2007 | Tilton et al. | |
| 2001/0013516 A1 | 8/2001 | Boecker | 220/562 |
| 2002/0031200 A1 | 3/2002 | Metell | 376/370 |
| 2002/0031431 A1 | 3/2002 | Akiyama et al. | 417/198 |
| 2002/0043289 A1 | 4/2002 | Goodyear | 137/888 |
| 2002/0073972 A1 | 6/2002 | Orsini et al. | 123/497 |
| 2002/0074059 A1 | 6/2002 | Schaefer et al. | 141/325 |
| 2002/0078917 A1 | 6/2002 | Suganuma | 123/196 |
| 2002/0081211 A1 | 6/2002 | Benghezal et al. | 417/87 |
| 2002/0124576 A1 | 9/2002 | Loibl et al. | 62/64 |
| 2002/0172601 A1 | 11/2002 | Lienig | 417/198 |
| 2003/0017767 A1 | 1/2003 | Gokan | 440/88 |
| 2003/0037775 A1 | 2/2003 | Gokan | 123/572 |
| 2003/0044299 A1 | 3/2003 | Thomas et al. | 418/206.9 |
| 2003/0102034 A1 | 6/2003 | Aschoff | 137/565.22 |
| 2003/0118455 A1 | 6/2003 | Vilela et al. | 417/189 |
| 2003/0145728 A1 | 8/2003 | Fuhling et al. | 95/146 |
| 2004/0013535 A1 | 1/2004 | Hutchinson et al. | 417/77 |
| 2004/0112069 A1 | 6/2004 | Loibl et al. | 62/64 |
| 2004/0141410 A1 | 7/2004 | Fenton et al. | 366/163.2 |
| 2004/0144806 A1 | 7/2004 | Shimada et al. | 222/321.7 |
| 2004/0177886 A1 | 9/2004 | Nagata et al. | 137/571 |
| 2005/0017514 A1 | 1/2005 | Tocher | 290/55 |
| 2005/0067333 A1 | 3/2005 | Grollitsch et al. | 209/599 |
| 2005/0067736 A1 | 3/2005 | Welsh et al. | 264/259 |
| 2005/0069077 A1 | 3/2005 | Offer et al. | 376/294 |
| 2005/0069445 A1 | 3/2005 | Ebara et al. | 418/63 |
| 2005/0070751 A1 | 3/2005 | Capote et al. | 588/311 |
| 2005/0071689 A1 | 3/2005 | Coward et al. | 713/300 |
| 2005/0072028 A1 | 4/2005 | Miskin | 37/466 |
| 2005/0072162 A1 | 4/2005 | Hoff et al. | 60/785 |
| 2005/0072166 A1 | 4/2005 | Lee et al. | 62/135 |
| 2005/0072550 A1 | 4/2005 | Nagasaka et al. | 164/135 |
| 2005/0072581 A1 | 4/2005 | Miskin | 172/2 |
| 2005/0072603 A1 | 4/2005 | Criscione et al. | 177/126 |
| 2005/0072662 A1 | 4/2005 | Holtzapple et al. | 202/155 |
| 2005/0072759 A1 | 4/2005 | Yamada et al. | 219/69.12 |
| 2005/0073146 A1 | 4/2005 | Dachne | 285/272 |
| 2005/0074286 A1 | 4/2005 | Swistak et al. | 405/43 |
| 2005/0074303 A1 | 4/2005 | Morohashi et al. | 406/194 |
| 2005/0074345 A1 | 4/2005 | Deichmann et al. | 417/423.14 |
| 2005/0074517 A1 | 4/2005 | Hazama | 425/589 |
| 2005/0074720 A1 | 4/2005 | Anderson | 433/136 |
| 2005/0168949 A1 | 8/2005 | Tilton et al. | 361/699 |
| 2006/0108100 A1 * | 5/2006 | Goldman et al. | 165/80.4 |
| 2007/0177348 A1 * | 8/2007 | Kehret et al. | 361/690 |

FOREIGN PATENT DOCUMENTS

| | | |
|---|---|---|
| EP | 1 210 983 | 1/1996 |
| EP | 555 984 | 10/1996 |
| EP | 882 480 | 10/1996 |
| EP | 1 179 643 | 7/2001 |
| EP | 1 457 685 | 3/2004 |
| GB | 122278 | 1/1919 |
| JP | 52-18206 | 2/1977 |
| JP | 3 151 422 | 6/1991 |
| JP | 5-245355 | 9/1993 |

* cited by examiner

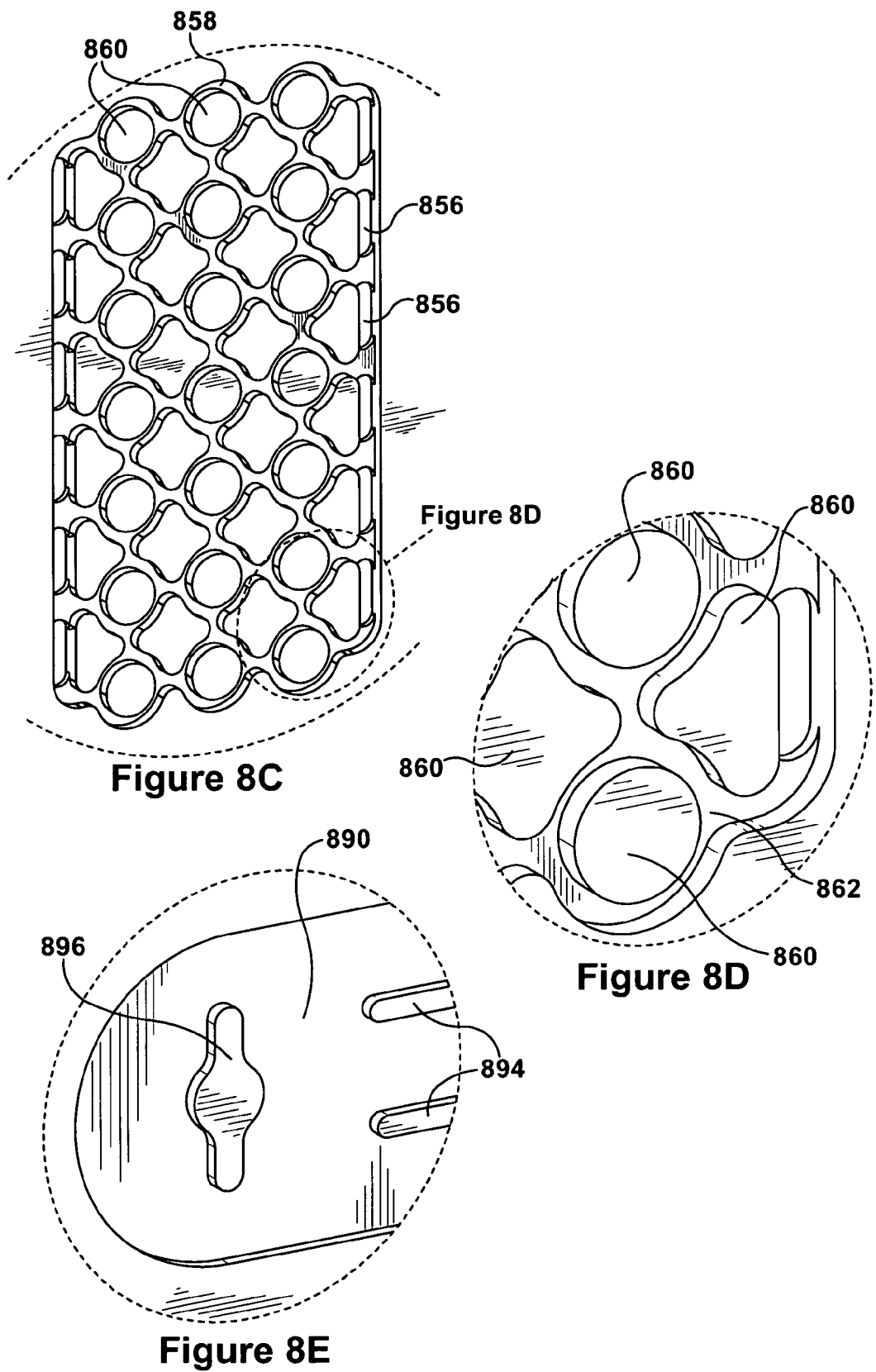

ENCLOSURE WITH FLUID INDUCEMENT CHAMBER

RELATED APPLICATION

This application claims priority under 35 U.S.C. §119 (e) to U.S. Provisional Patent Application No. 60/669,260 filed on Apr. 7, 2005 and U.S. Provisional Patent Application No. 60/674,032 filed on Apr. 22, 2005. The entire disclosures of these provisional applications are hereby incorporated by reference.

FIELD OF THE INVENTION

This invention relates generally to an enclosure with a fluid inducement chamber and, more particularly, to an enclosure with a chamber which uses a motive fluid to remove an operative fluid from the enclosure.

BACKGROUND OF THE INVENTION

Electronic devices are commonly used for the manipulation, monitoring, and/or control of many different types of equipment and/or instrumentation. If electronic devices overheat, as a result of internal operation and/or the surrounding environment, there is a risk that they will not function properly. Likewise, if electronic devices are subjected to low temperatures (e.g., arctic climates and/or high altitudes), there is also the possibility of malfunction. As such, a heat-transfer fluid is often sprayed, sprinkled, poured, or otherwise conveyed to the electronic devices to heat/cool them to an acceptable temperature. If the electronic devices are enclosed within a container space, the heat-transfer fluid must be drained therefrom to maximize the efficiency of the cooling/heating process. In some cases, the associated equipment and/or instrumentation is being used on a vehicle (e.g., ground, sea, undersea, airborne, space, etc.), whereby the draining may be required in many attitudes, orientations and/or acceleration directions.

SUMMARY OF THE INVENTION

The present invention provides an enclosure with a fluid inducement chamber which uses a motive fluid to drain an operative fluid from its container space. Because the enclosure uses a motive fluid as the draining inducement, it can be built to preferentially drain liquid when both liquid and vapor are present in the container space. Additionally or alternatively, the draining system is not susceptible to cavitation, vapor lock, and/or the other problems so often created when a conventional suction pump is used for draining purposes.

The enclosure can be used in coordination with a spray heat-transfer process, including, for example, single-phase cooling, two-phase heating, and single-phase heating. In such these heat-transfer processes, the space surrounding the object component (e.g., the electronic device), must be empty, or at least almost empty, of liquid. Cooling/heating will still occur if there is flooding and/or pooling within this space, but at reduced level of effectiveness. The enclosure can be constructed to prevent (or at least minimize) flooding and/or pooling within the container space by providing a liquid draining method that is reliable, dependable, and efficient. However, the applications for this enclosure extend far beyond just draining a heat-transfer fluid from a container space. Indeed, the enclosure can be used in any situation where a fluid needs to be removed from a container space in a consistent manner, for any purpose or reason. That being said, the enclosure will find special application in situations where liquid preferentially needs to be removed from a container space containing both liquid and vapor.

More particularly, the enclosure comprises a wall structure defining a container space which can contain, for example, one or more electronic devices. The wall structure includes an entrance for an operative fluid (e.g., a heat-transfer fluid) into the container space, and an exit for the operative fluid from the container space. Circuit(s) and/or chamber(s) in the wall structure cause a motive fluid to produce a differential pressure that induces the operative fluid in the container space through the exit to the enclosure's outlet.

The circuit(s)/chamber(s) can comprise an inducement chamber, an operative fluid circuit forming a flow path from the container space through the exit to the inducement chamber, and a motive fluid circuit forming a flow path from an inlet to the inducement chamber. The inducement chamber induces the operative fluid to flow (through the operative fluid circuit) from the container space, through the exit, and then to the inducement chamber, and then induces the operative fluid and the motive fluid to drain to the outlet (e.g., via a drain circuit).

The operative fluid circuit can also form a flow path from an inlet for the operative fluid to the entrance(s) into the container space. This inlet for the operative fluid can be the same inlet as the inlet for the motive fluid, or it can be a separate independent inlet. In either or any event, the flow path to the entrance (and even the entrance itself) can be constructed to supply the operative fluid to the container space in a desired manner. Additionally or alternatively, the operative fluid can be directed towards particular locations within the container space whereat its intended purpose is specifically required. For example, the operative fluid can be provided in a continuous spray of liquid droplets (e.g., consistent with a single-phase or two-phase cooling/heating process) and/or can be directed towards the locations of heat-generating electronic devices.

The enclosure can be used in combination with a recirculation circuit which recirculates fluid from the outlet back to an inlet for the operative fluid and/or the motive fluid. In other words, the enclosure can be part of a closed loop system wherein the same fluid is repeatedly used as the operative fluid and the motive fluid. If the operative fluid is a thermal-transfer fluid (e.g., for heating or cooling) or, for that matter, any fluid wherein an outlet-to-inlet temperature change is necessary or desired, a heat exchanger can be provided in the recirculation circuit.

The enclosure can include a plurality of exits from the container space and these exits can be arranged so that at least one exit is positioned to receive liquid operative fluid within the container space regardless of the orientation of the enclosure and/or the location of the operative fluid within the enclosure. At least one inducement chamber can be associated with each exit and, if so, the operative fluid circuit can lead the operative fluid through the nearest exit and to the associated inducement chamber. Such a multi-drain and multi-inducement chamber design allows the enclosure to be immune to gravity and thus not affected by changing orientations, adjusting attitudes, and/or different acceleration directions. As such, an enclosure constructed in this manner can be used in conjunction with military, government, commercial, and/or private vehicles (e.g., aircraft, spacecraft, missiles, submarines, ships, and even ground vehicles) to not only heat/cool electronic devices but also, for example, to supply fuel and/or oil from tanks and/or sumps to associated equipment.

The wall structure of the enclosure can be at least partially formed by a stack of relatively thin plates in face-to-face contact and joined together in a fluid-tight manner. The plates can have openings and/or grooves at least partially defining the inlet(s), the outlet(s), the entrance(s), the exit(s), the chamber(s), and/or the fluid circuit(s) of the enclosure. The operative fluid circuit defined by the plates can be such that the operative fluid is introduced into the container space in a manner compatible with a single-phase spray or two-phase spray evaporative cooling process.

These and other features are fully described and particularly pointed out in the claims. The following description and annexed drawings set forth in detail certain illustrative embodiments of the invention, these embodiments being indicative of but a few of the various ways in which the principles of the invention may be employed.

DRAWINGS

FIG. 1A is a perspective view of an enclosure 100 (comprising a board 200, a frame 300, and a plate stack 400) with electronic devices 114 positioned therewithin.

Figure 4A:
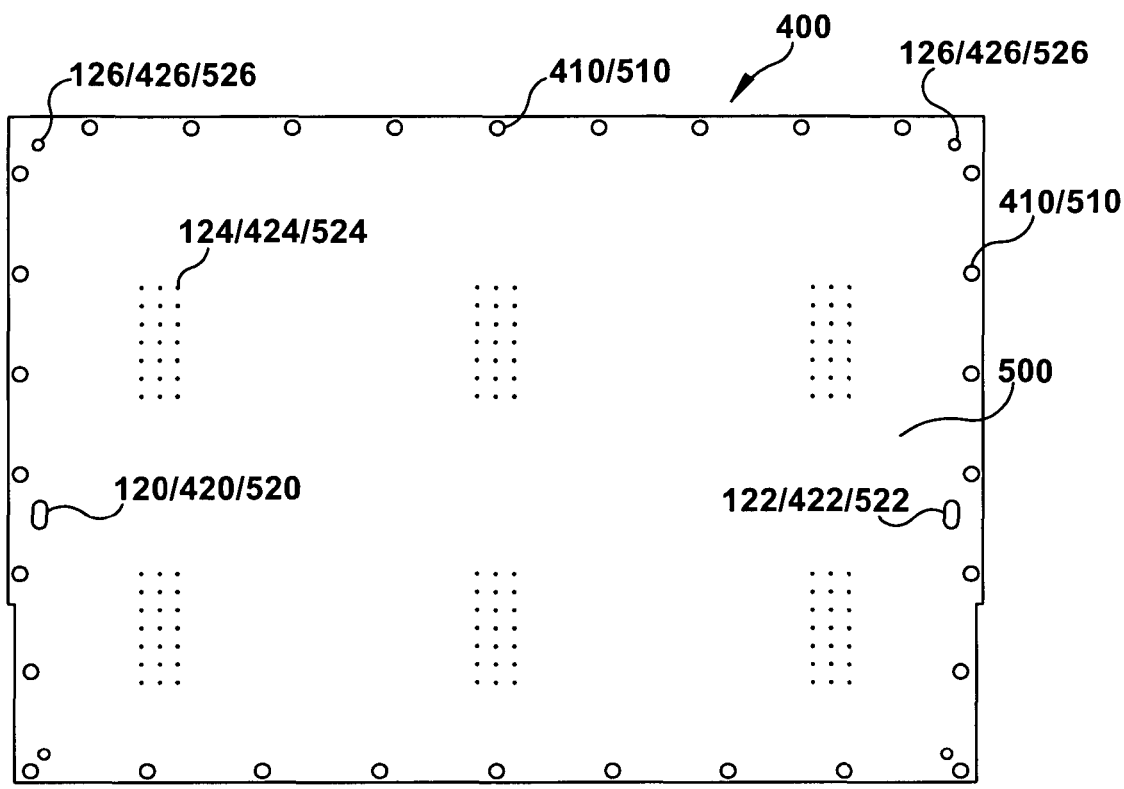
FIGS. 4A and 4B are views of the inner and outer surfaces, respectively, of the plate stack 400.
Figure 4B:
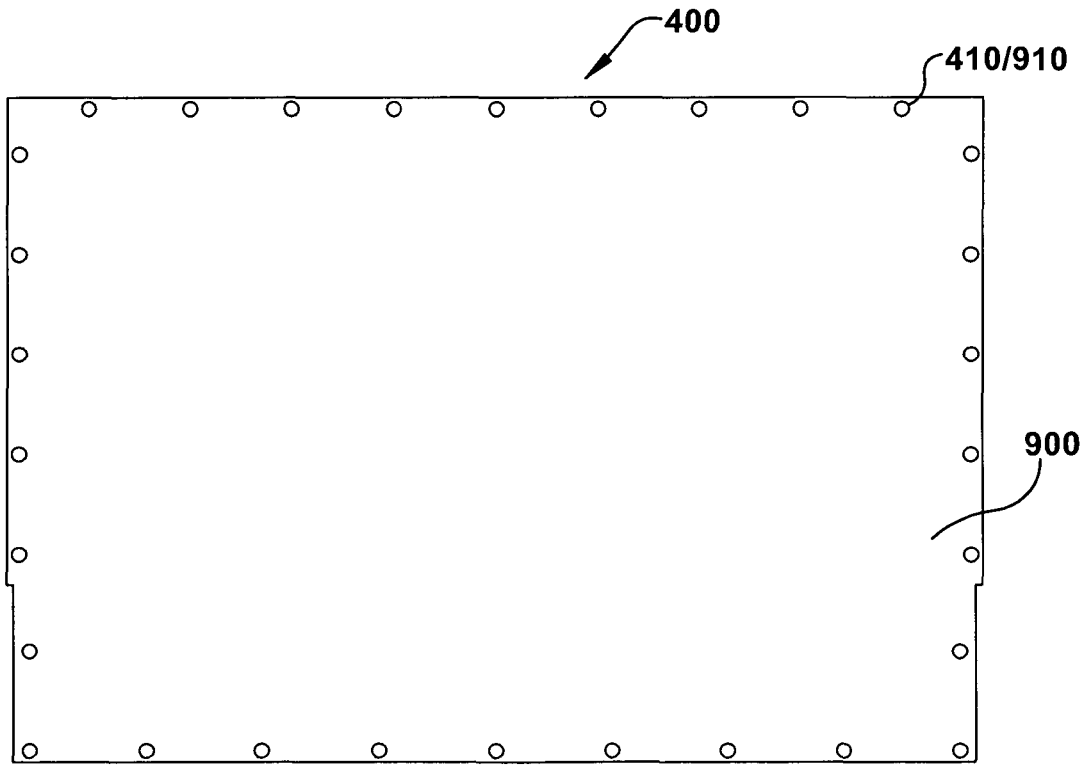
Figure 4C:
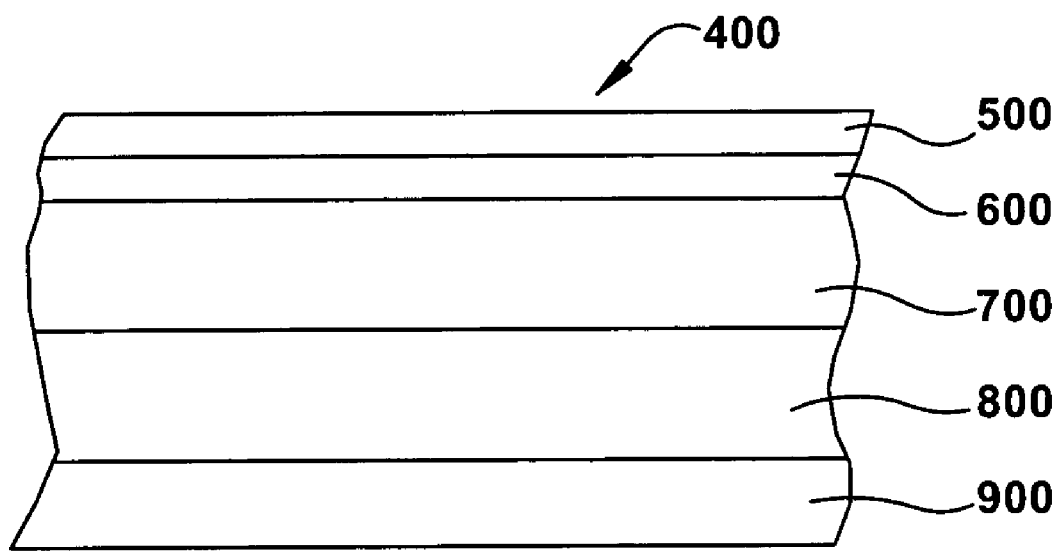

FIG. 4C is a side view of the plate stack 400, this view showing the stacking of plates 500, 600, 700, 800 and 900.

Figure 5C:
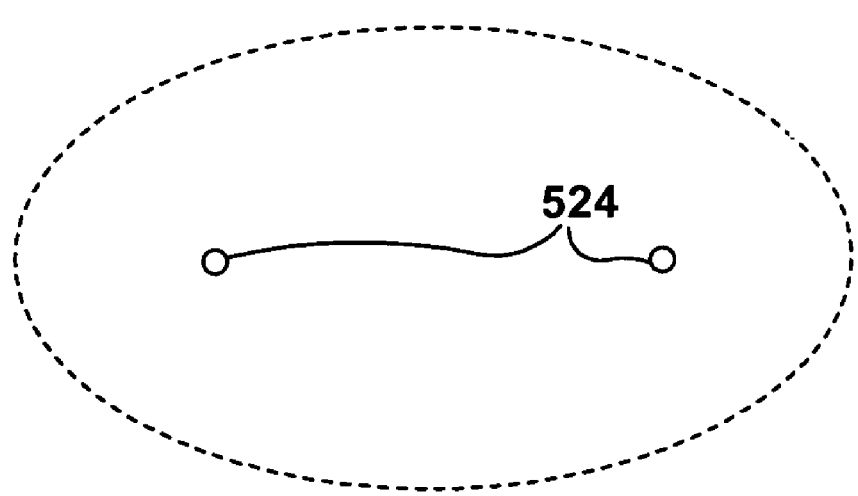
Figure 5A:
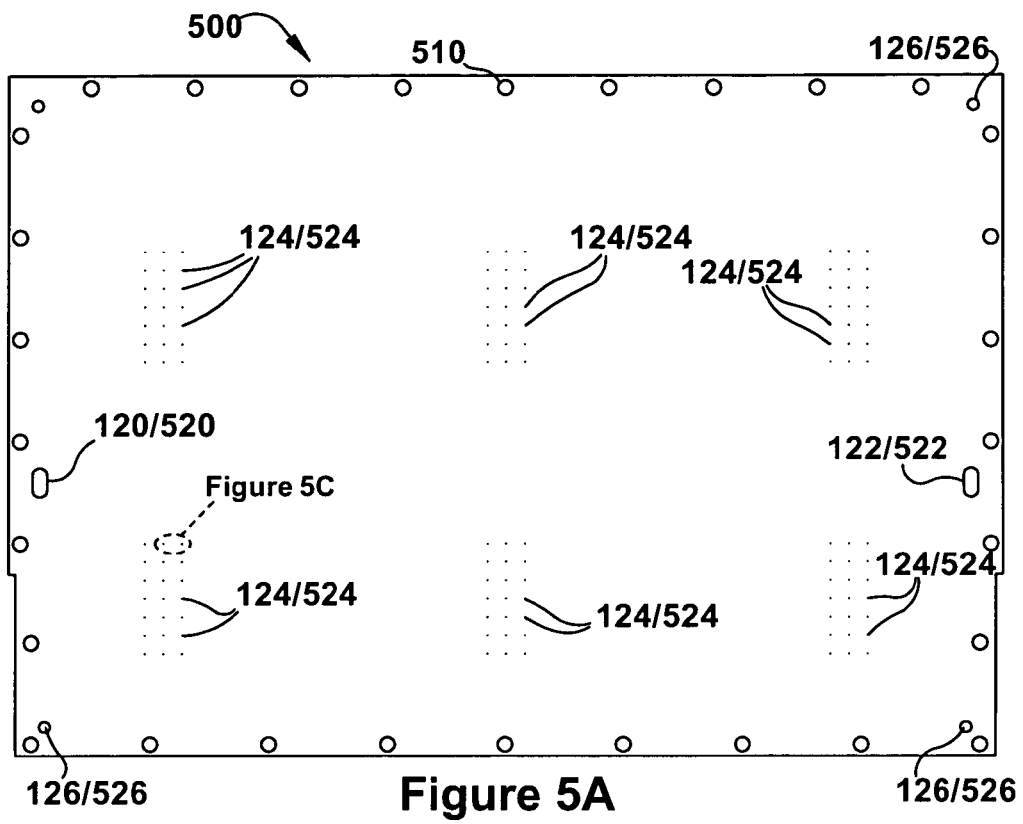
Figure 5B:
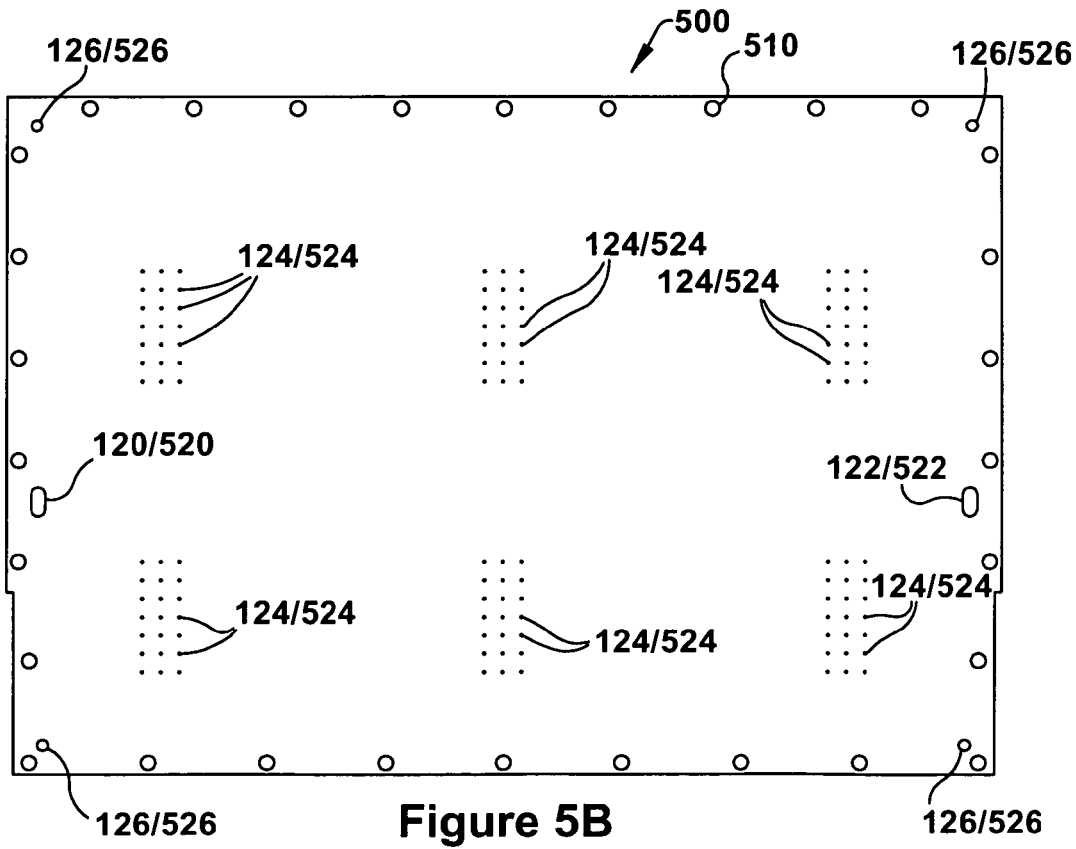

FIGS. 5A and 5B are views of the inner and outer surfaces, respectively, of the plate 500.

FIG. 5C is a closeup view of a region on the inner surface of the plate 500.

Figure 6A:
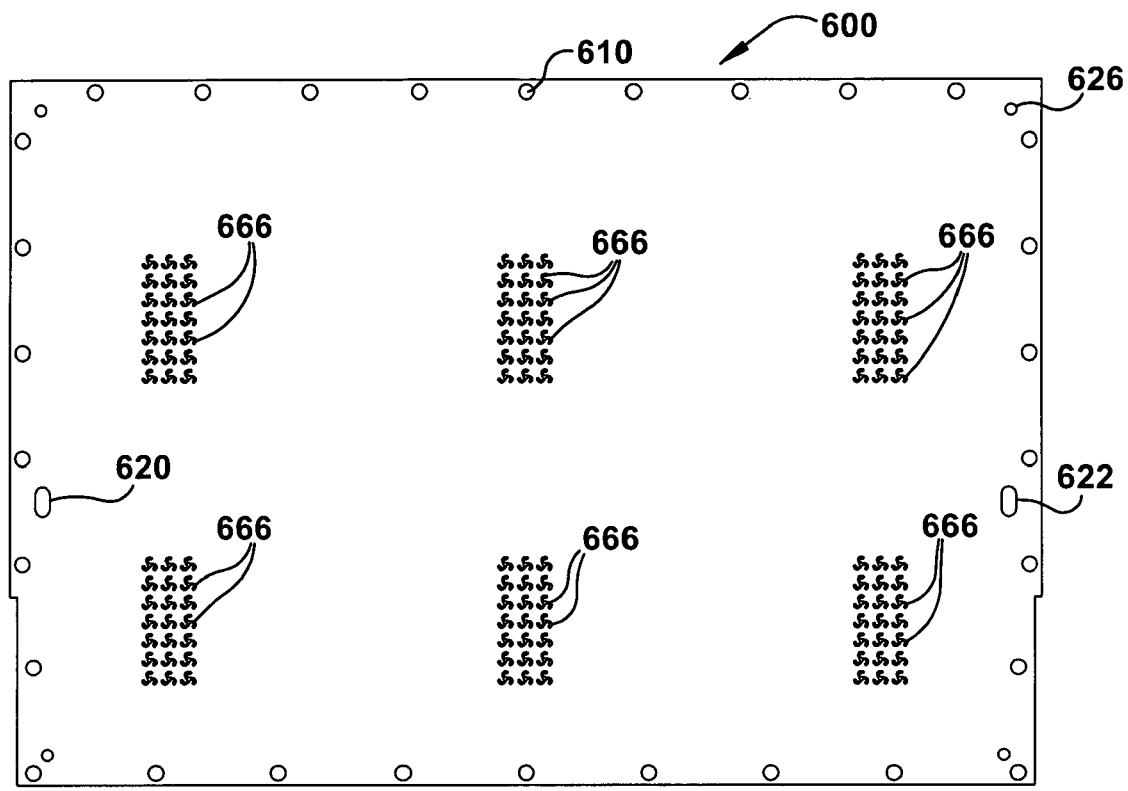
Figure 6B:
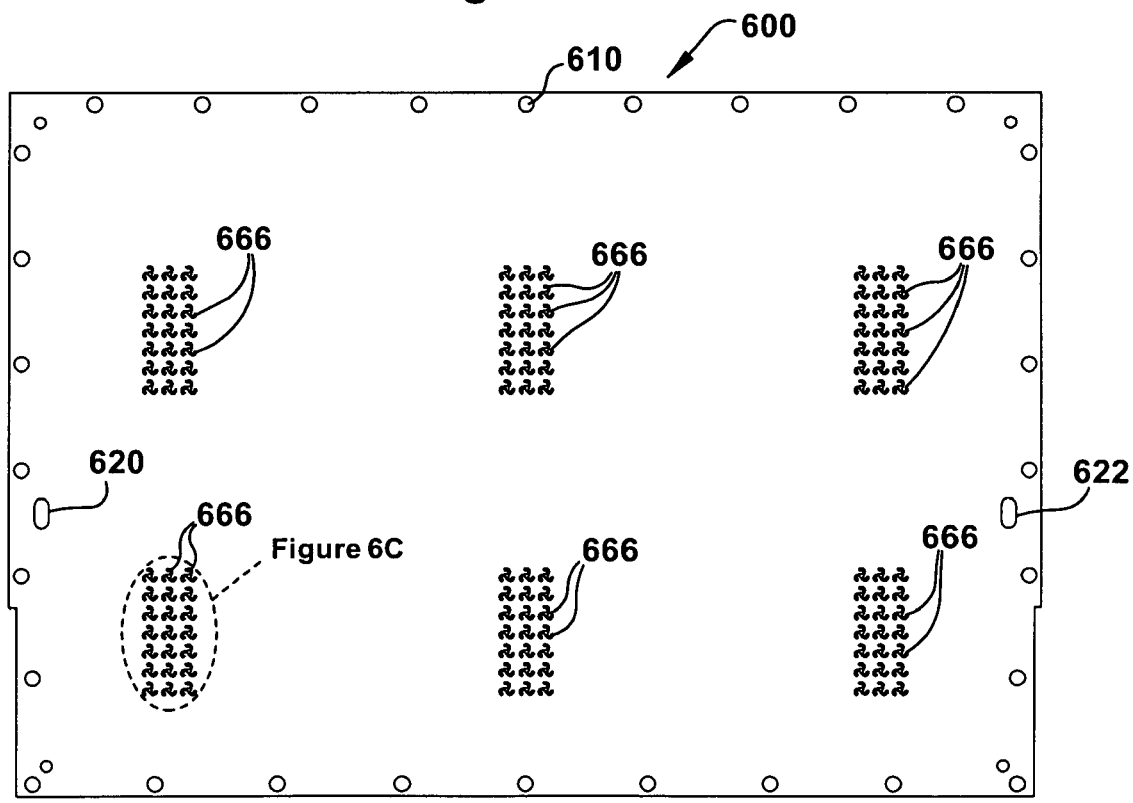

FIGS. 6A and 6B are views of the inner and outer surfaces, respectively, of the plate 600.

Figure 6C:
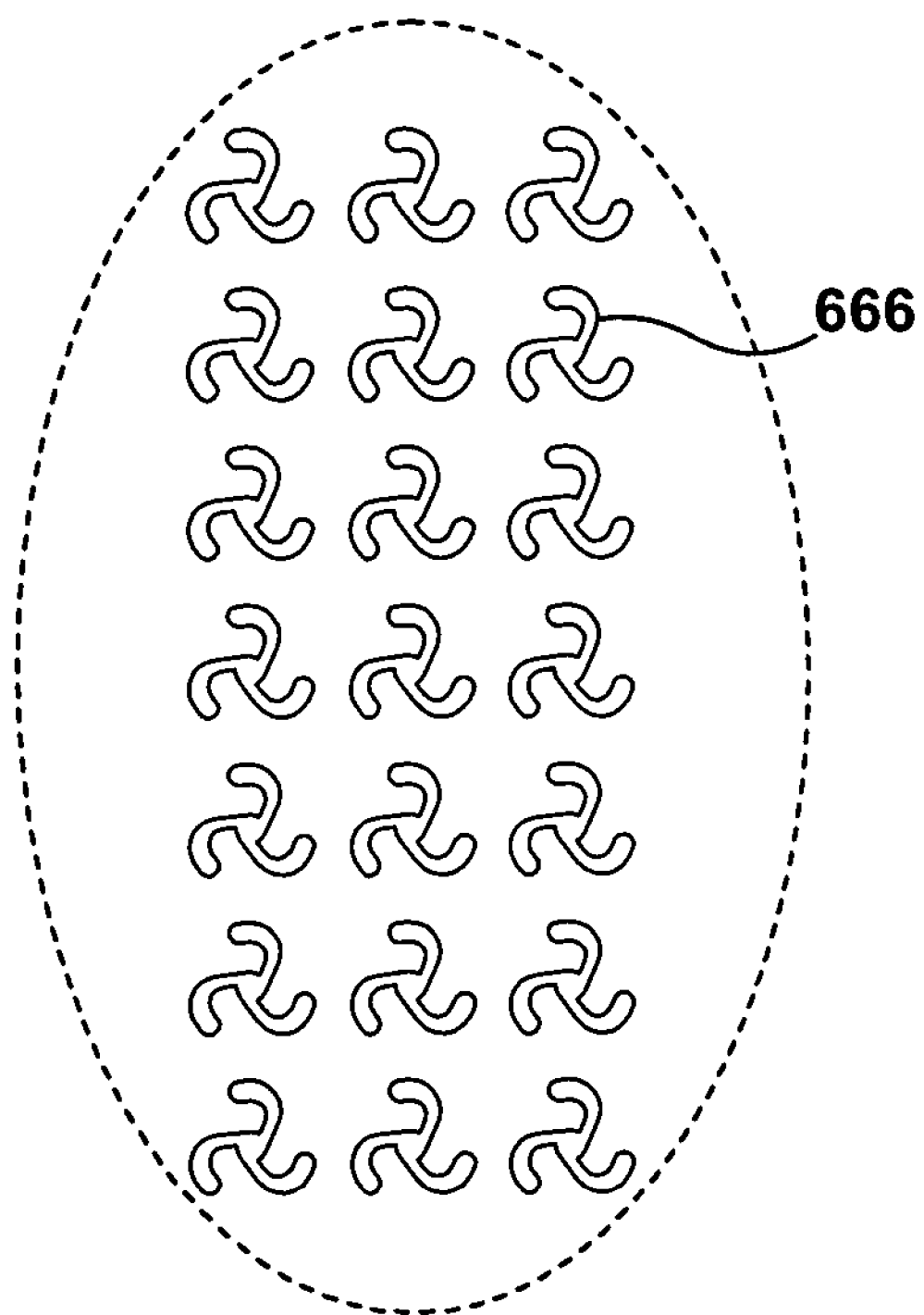

FIG. 6C is a closeup view of a region on the inner surface of the plate 600.

Figure 7A:
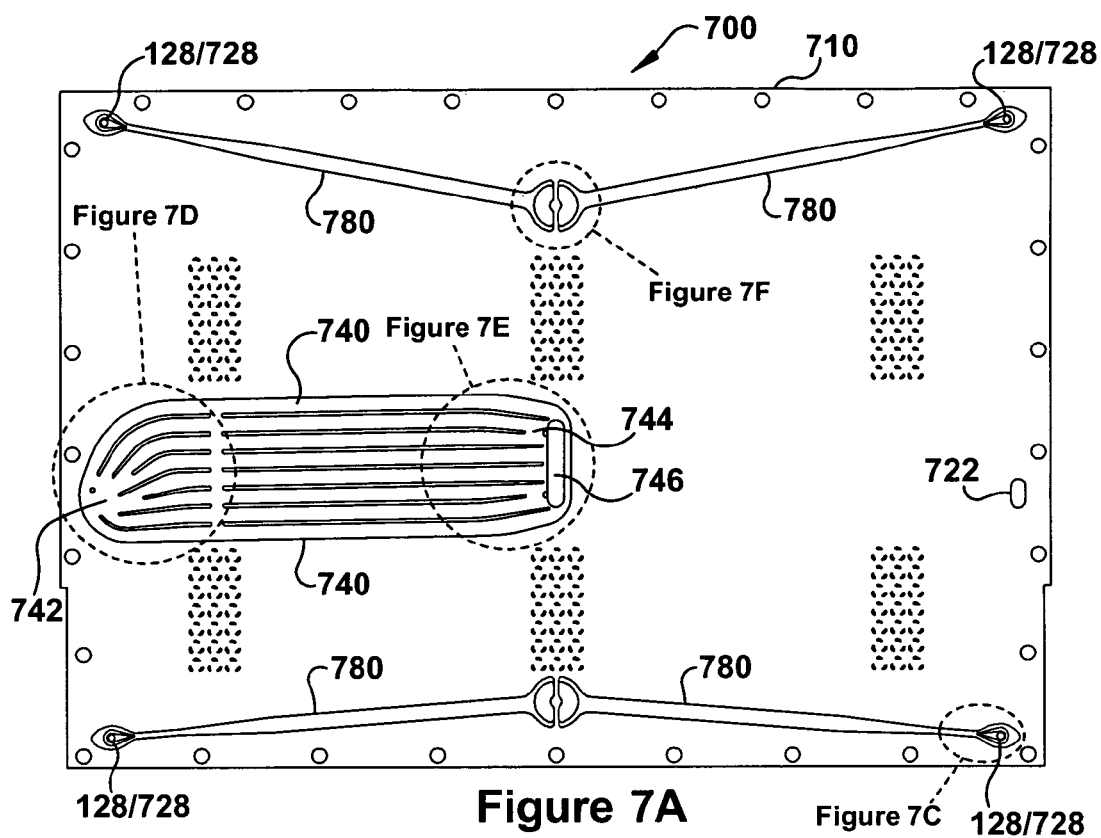
Figure 7B:
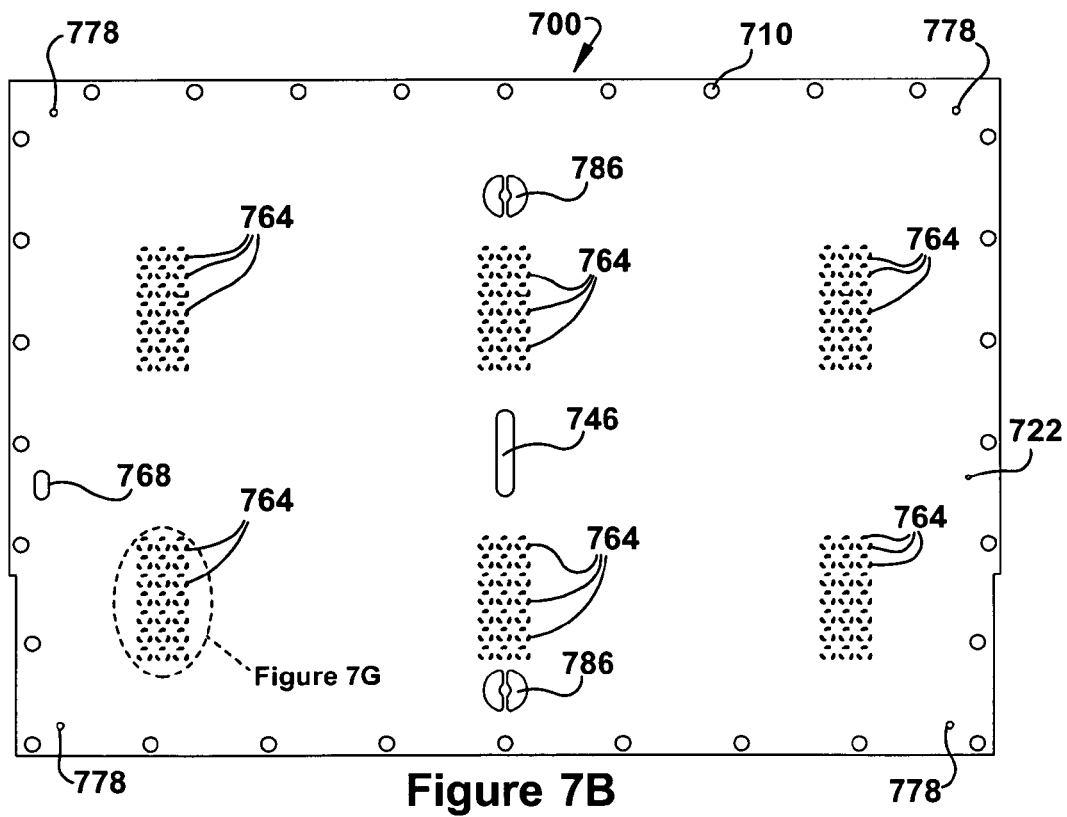

FIGS. 7A and 7B are views of the inner and outer surfaces, respectively, of the plate 700.

FIGS. 7C-7F are closeup views of regions on the inner surface of the plate 700.

Figure 7C:
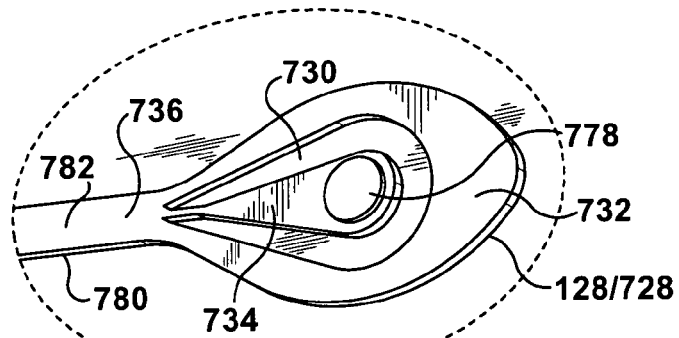
Figure 7D:
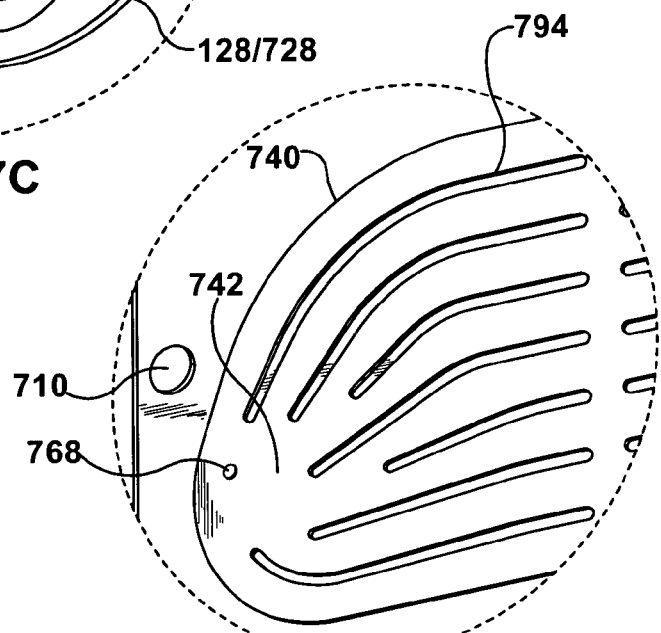
Figure 7E:
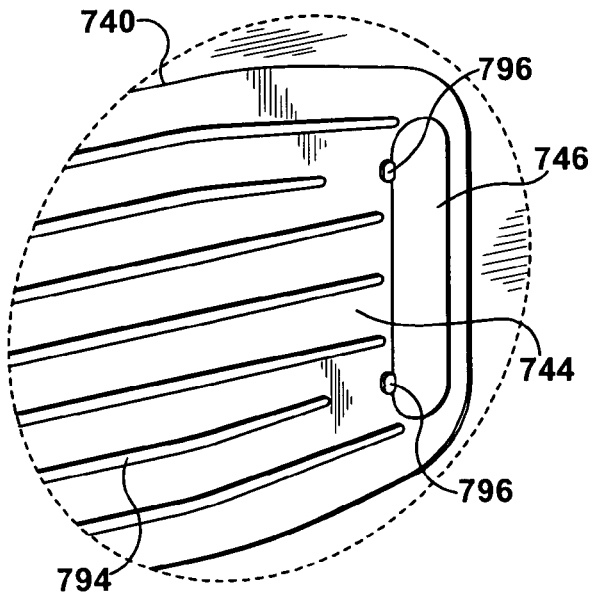
Figure 7F:
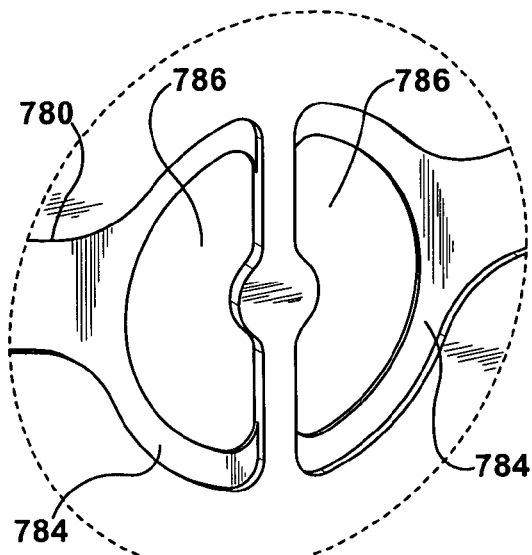
Figure 7G:
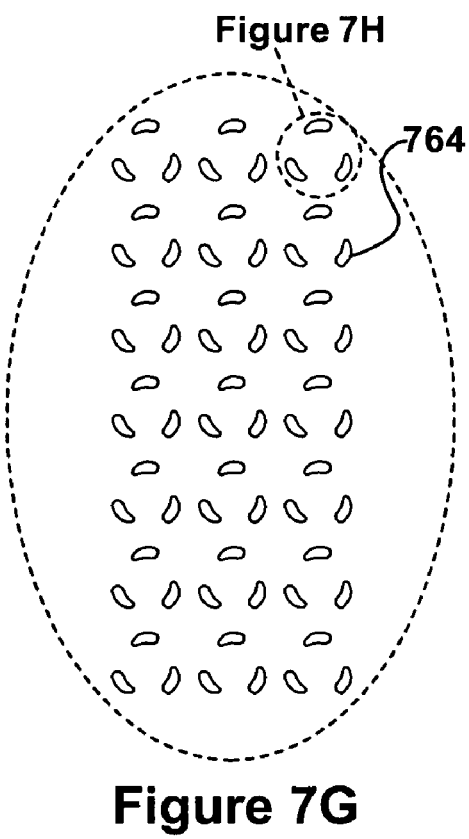
Figure 7H:
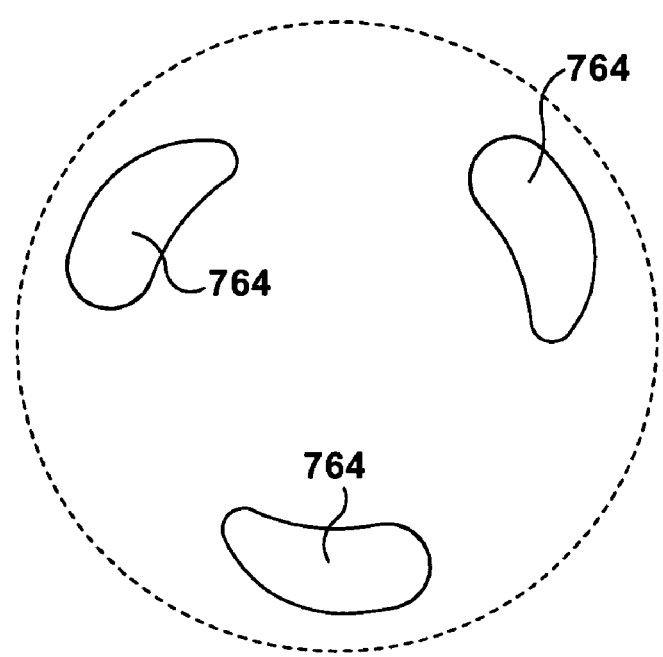

FIGS. 7G-7H are closeup views of regions on the outer surface of the plate 700.

Figure 8A:
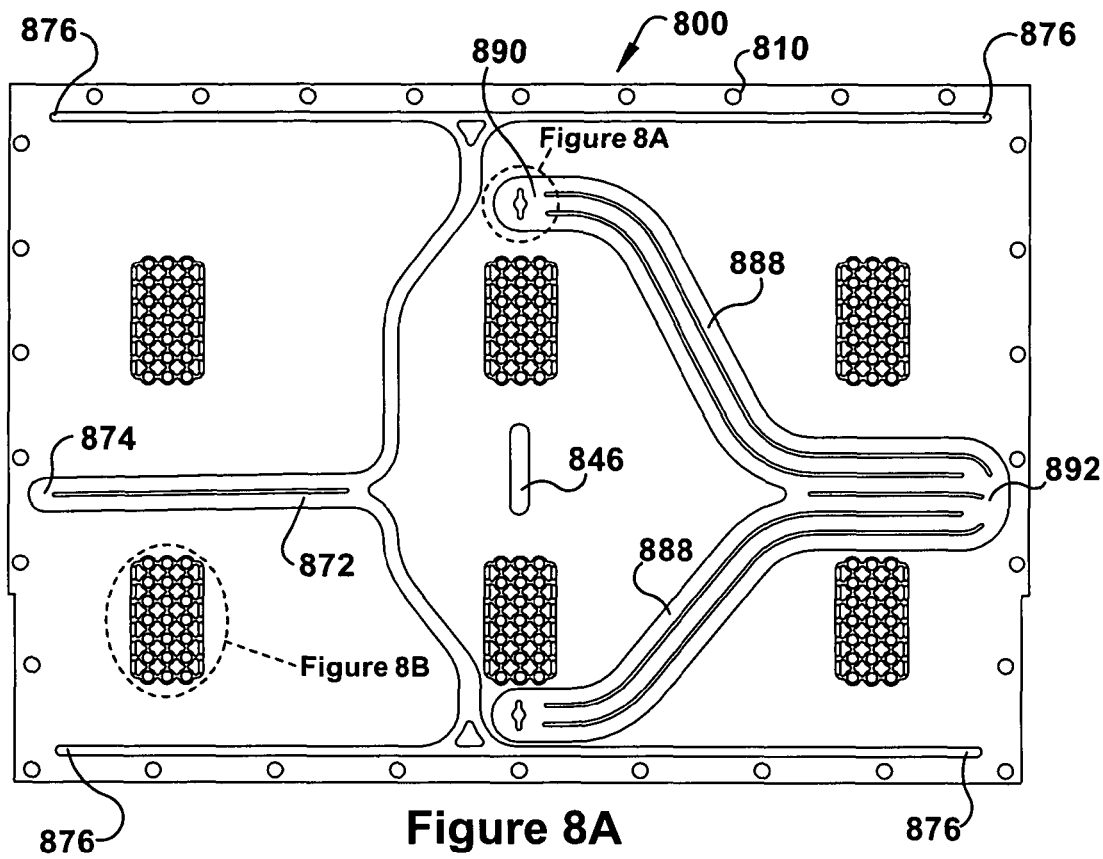
Figure 8B:
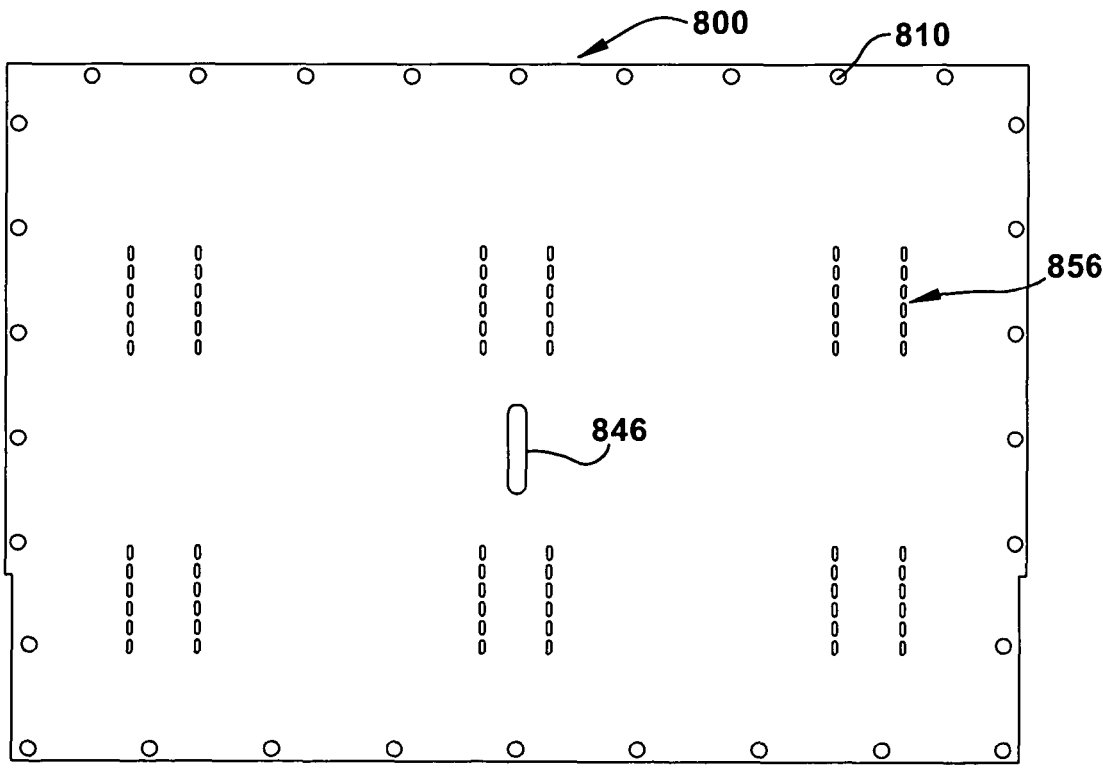

FIGS. 8A and 8B are views of the inner and outer surfaces, respectively, of the plate 800.

FIGS. 8C-8E are closeup views of regions on the inner surface of the plate 800.

Figure 9A:
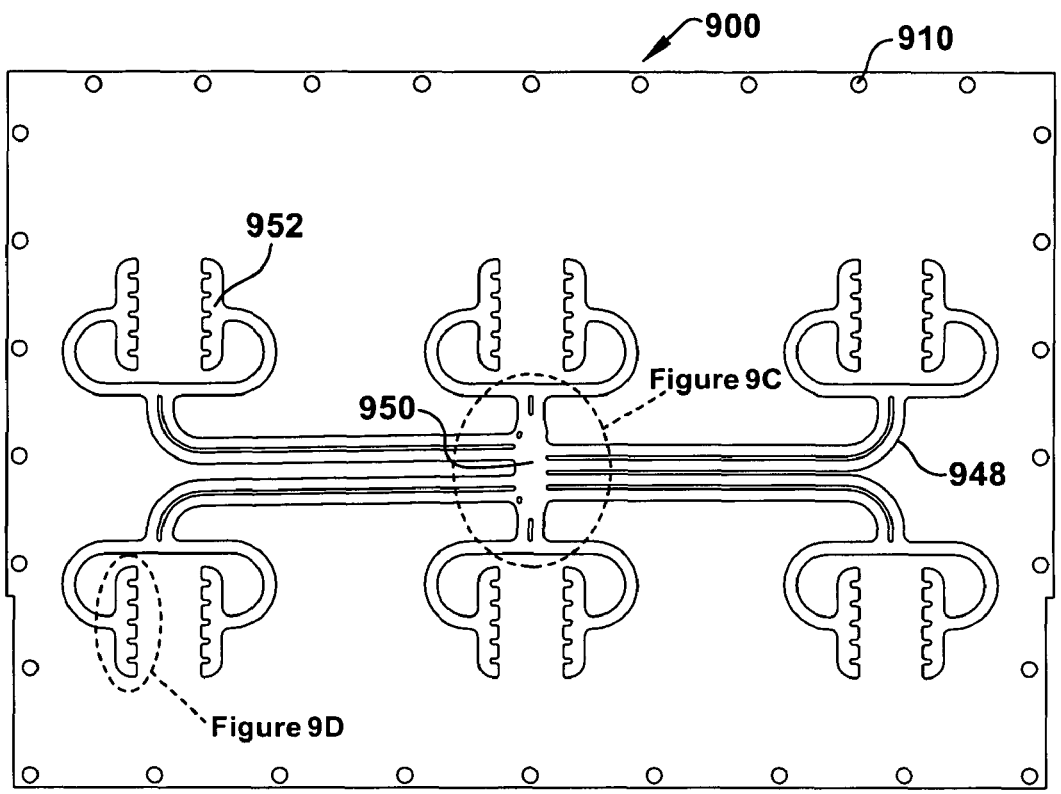
Figure 9B:
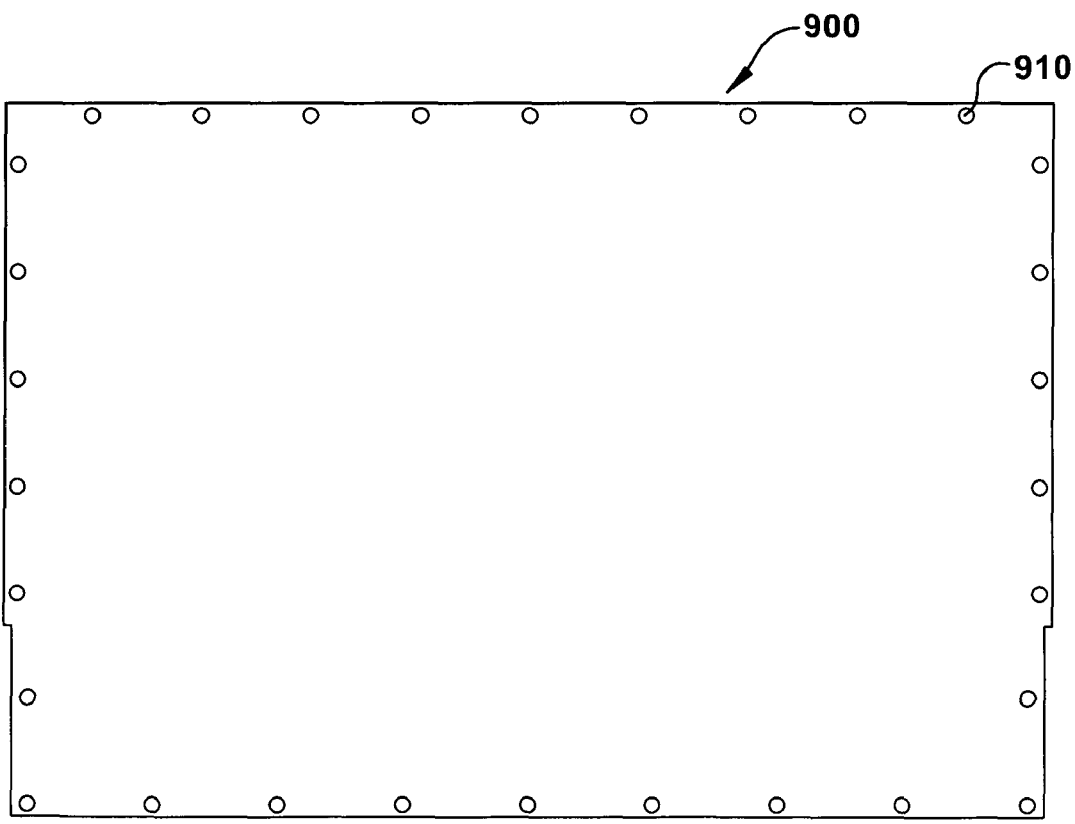

FIGS. 9A and 9B are views of the inner and outer surfaces, respectively, of the plate 900.

Figure 9C:
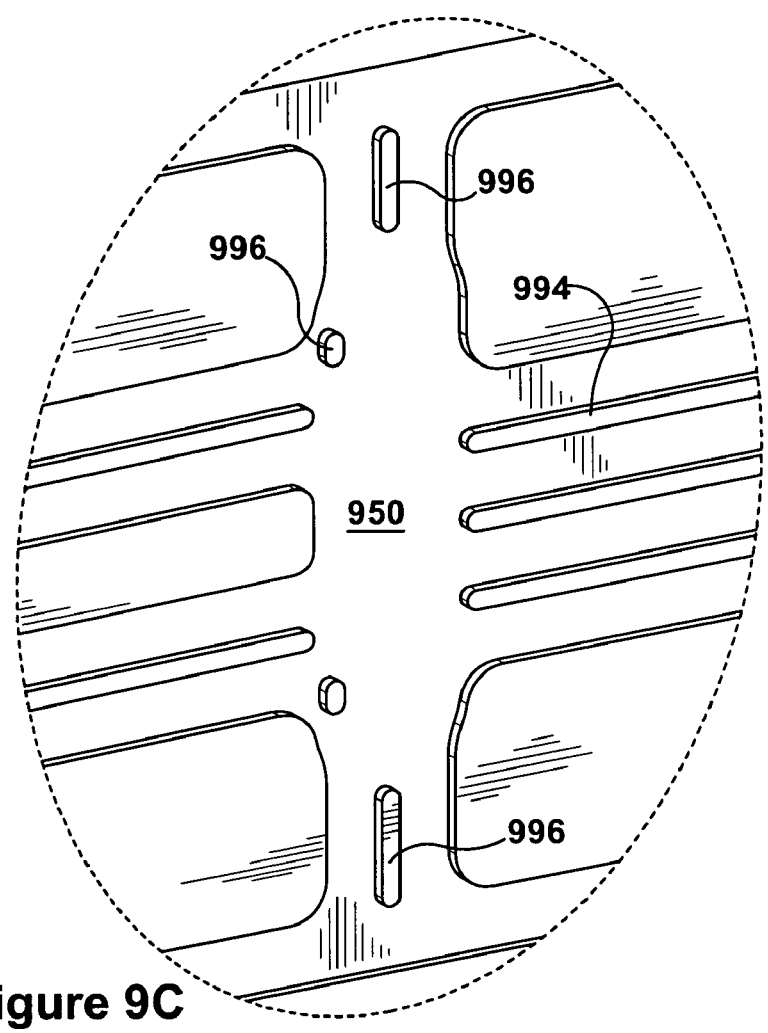
Figure 9D:
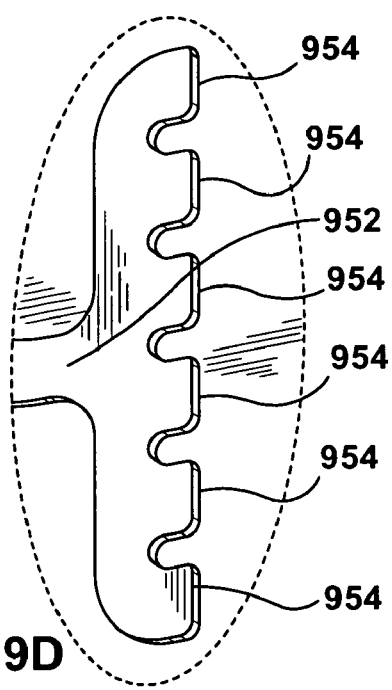

FIGS. 9C-9D are closeup views of regions on the inner surface of the plate 900.

Figure 10A:
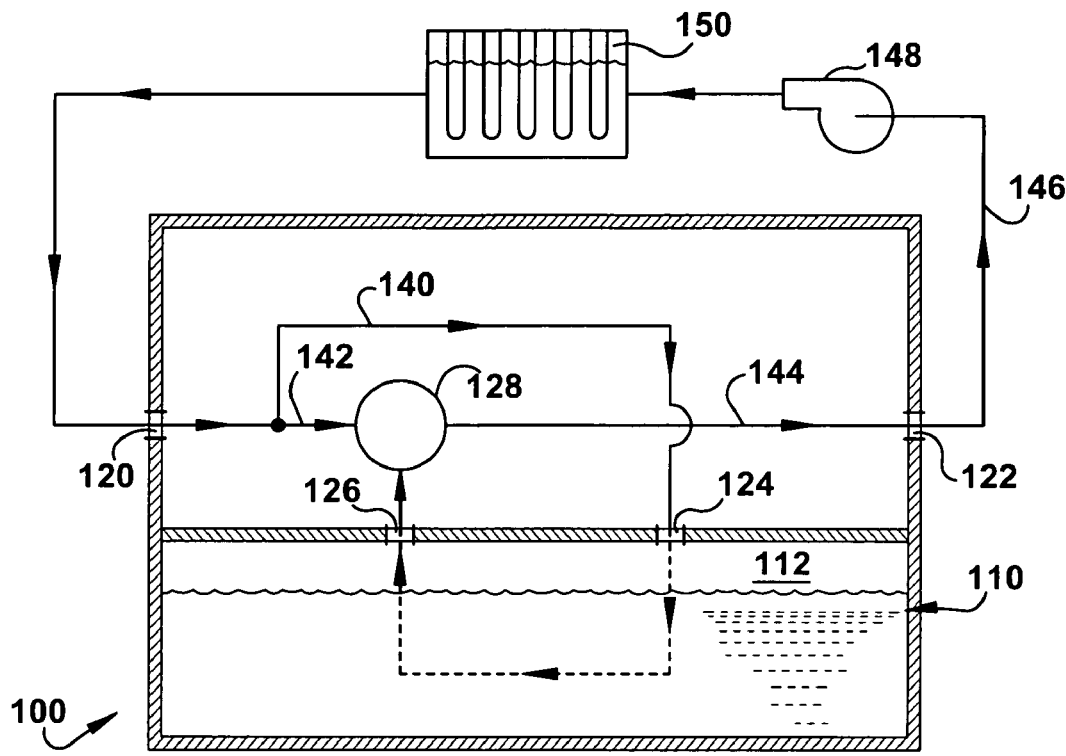
Figure 10B:
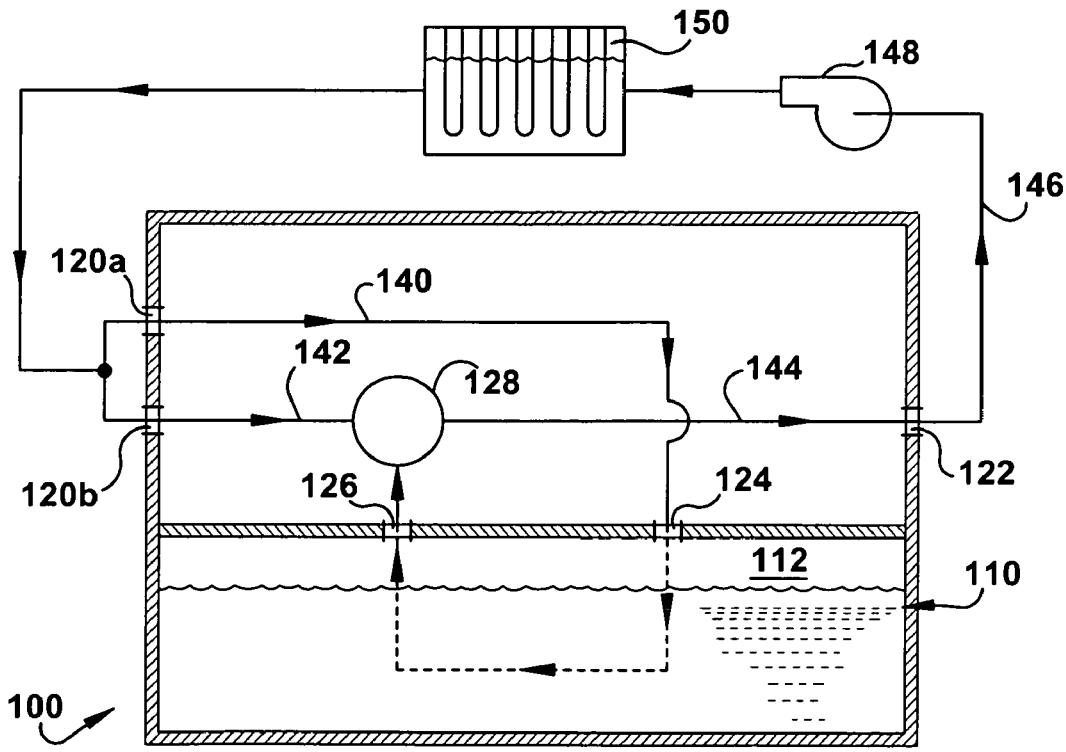
Figure 10C:
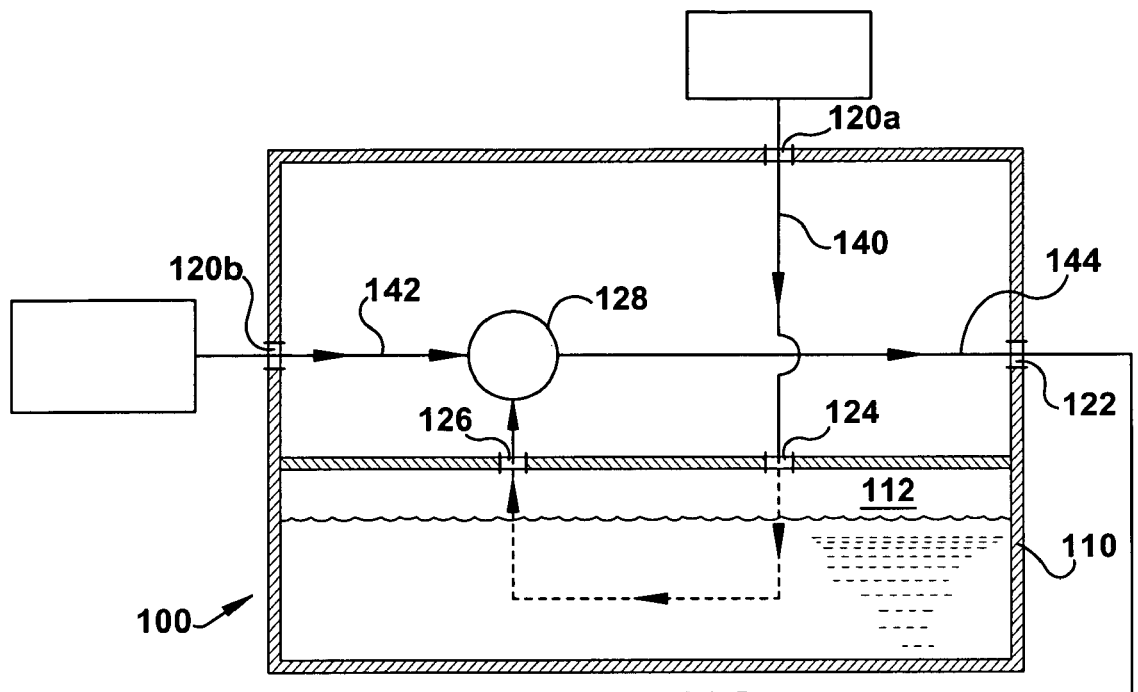

FIGS. 10A-10C are schematic views of possible fluid paths through the enclosure 100.

FIGS. 11A-11D are schematic views of possible drain patterns for the enclosure 100 in different orientations.

Figure 12A:
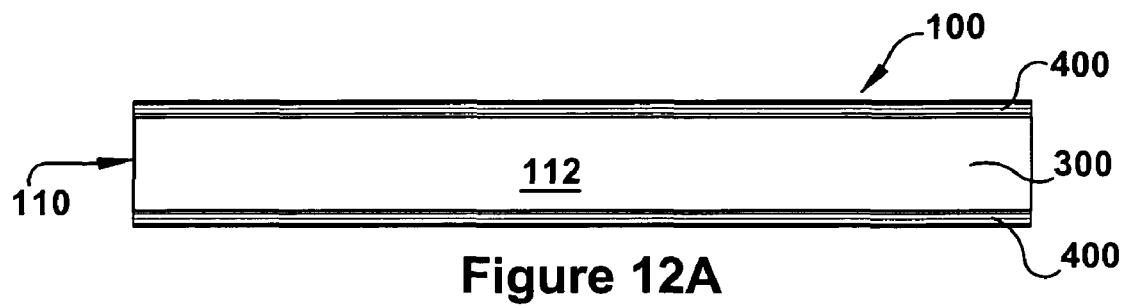

FIG. 12A is a schematic side view of the enclosure 100 when it comprises a frame 300 and two plate stacks 400.

Figure 12B:
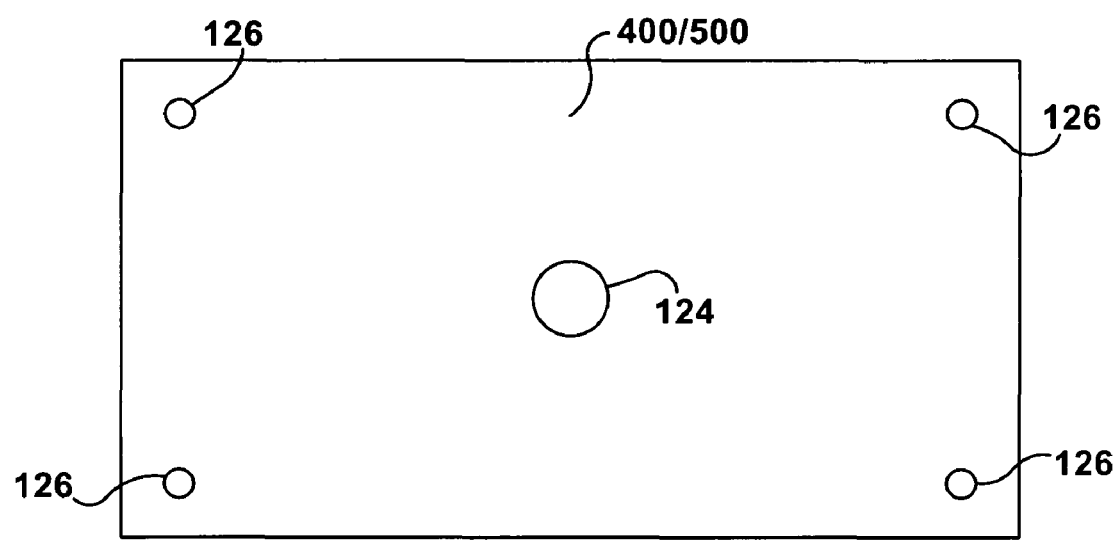
Figure 12C:
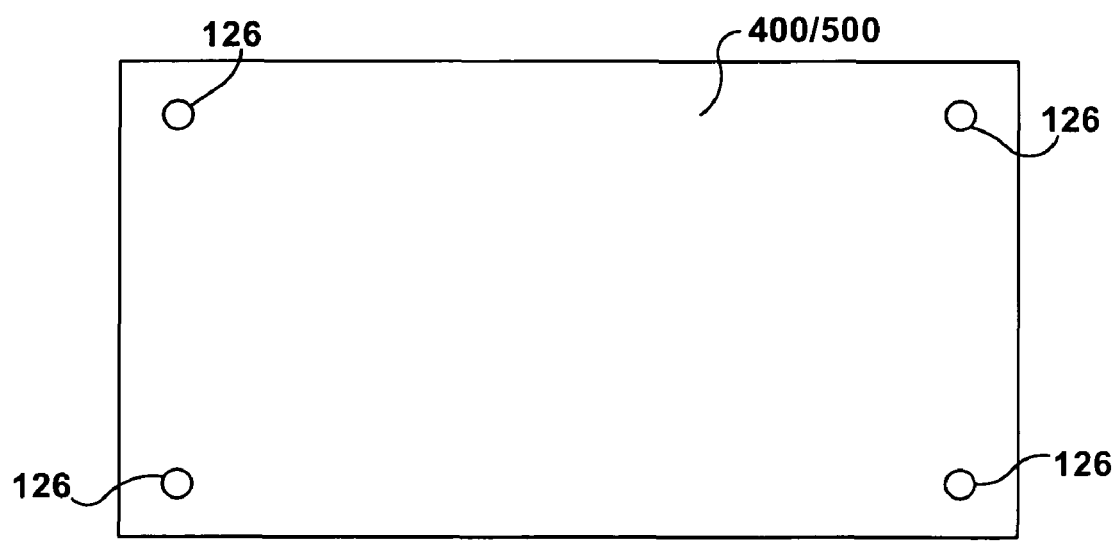

FIGS. 12B and 12C are schematic views of the inner surface of either or both of the plate stacks 400 in FIG. 12A.

Figure 13:
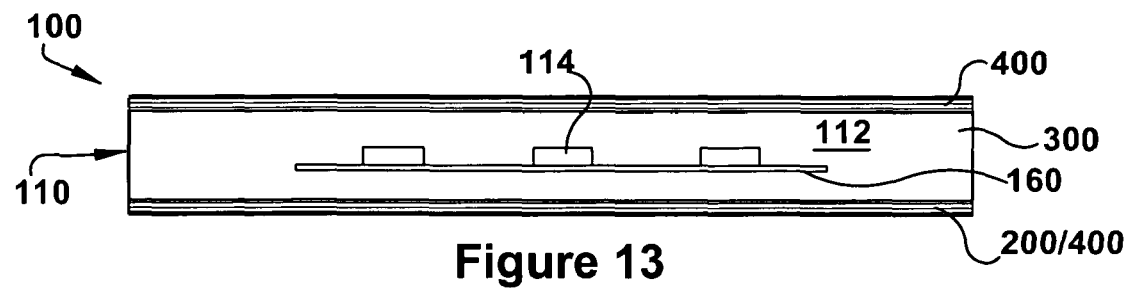

FIG. 13 is a schematic side view of the enclosure 100 with an electronic-device-carrying substrate 160 positioned therewithin.

Figure 14A:
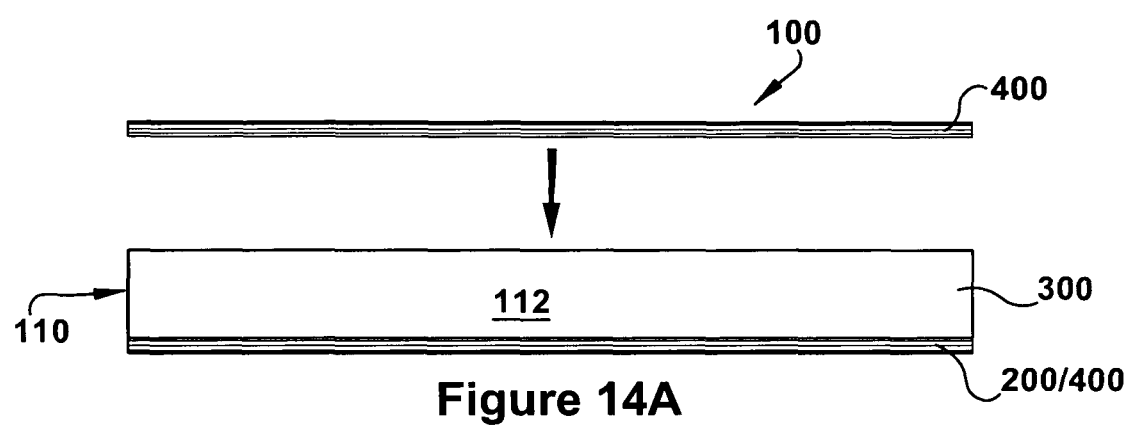
Figure 14B:
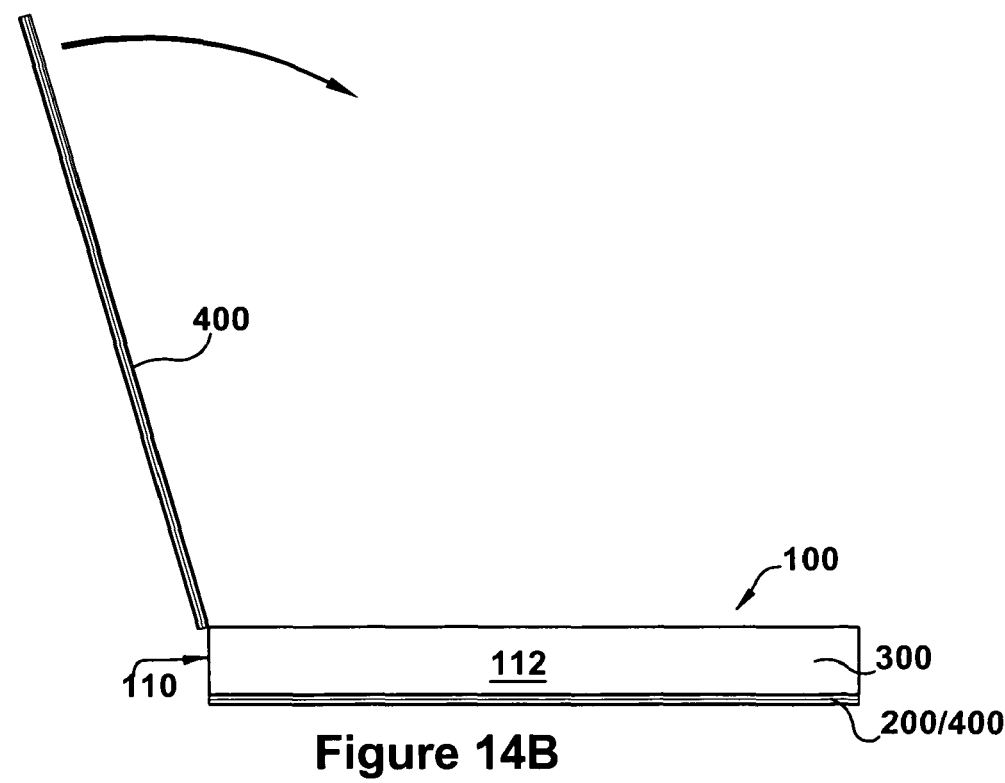

FIGS. 14A and 14B are schematic side views of two possible techniques of connecting, opening and/or closing the wall structure of the enclosure 100.

Figure 15:
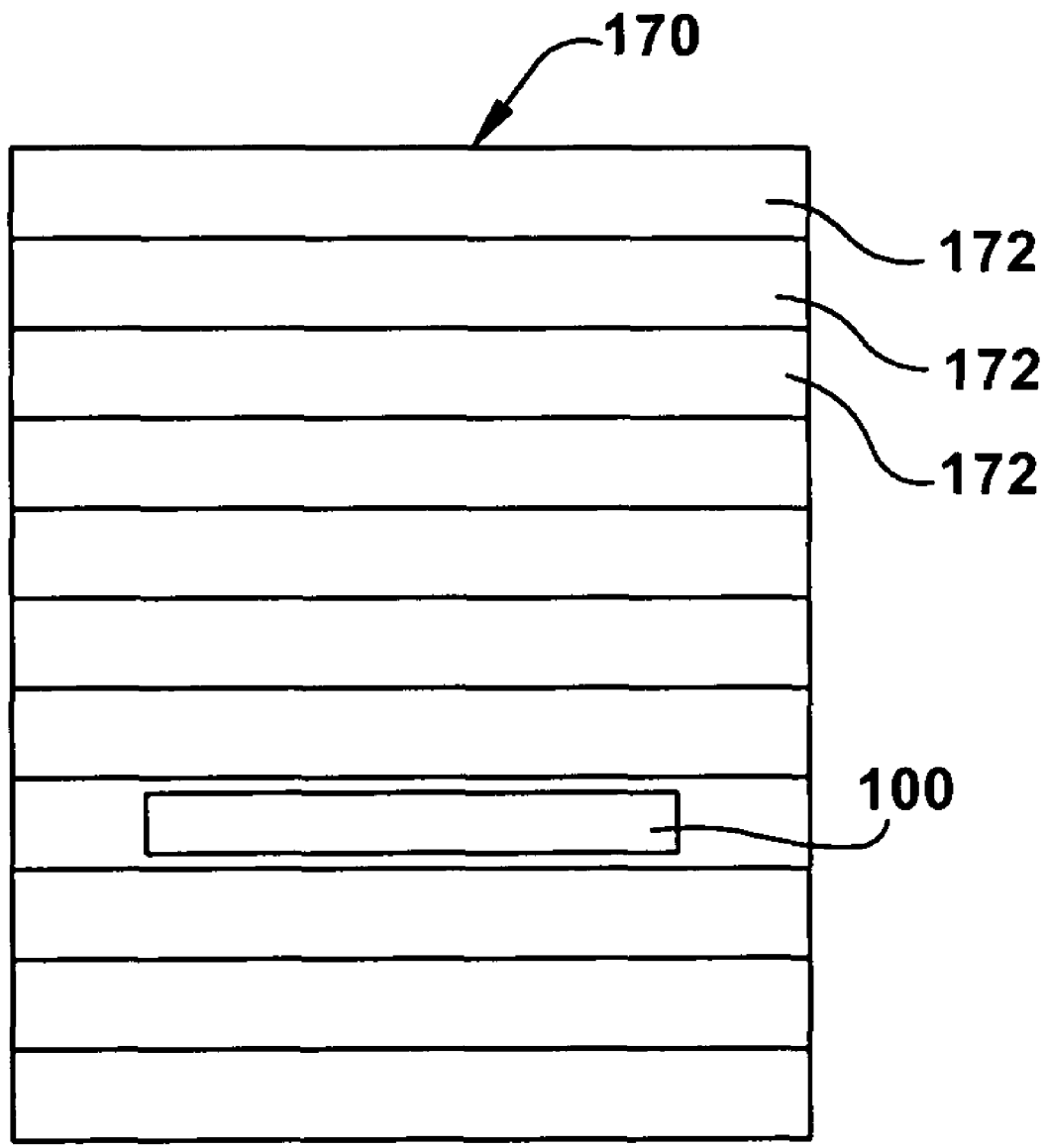

FIG. 15 is a schematic view of a chassis 170 having parallel slot shelves into which a plurality of the enclosures 100 can be installed.

DETAILED DESCRIPTION

Figure 1A:
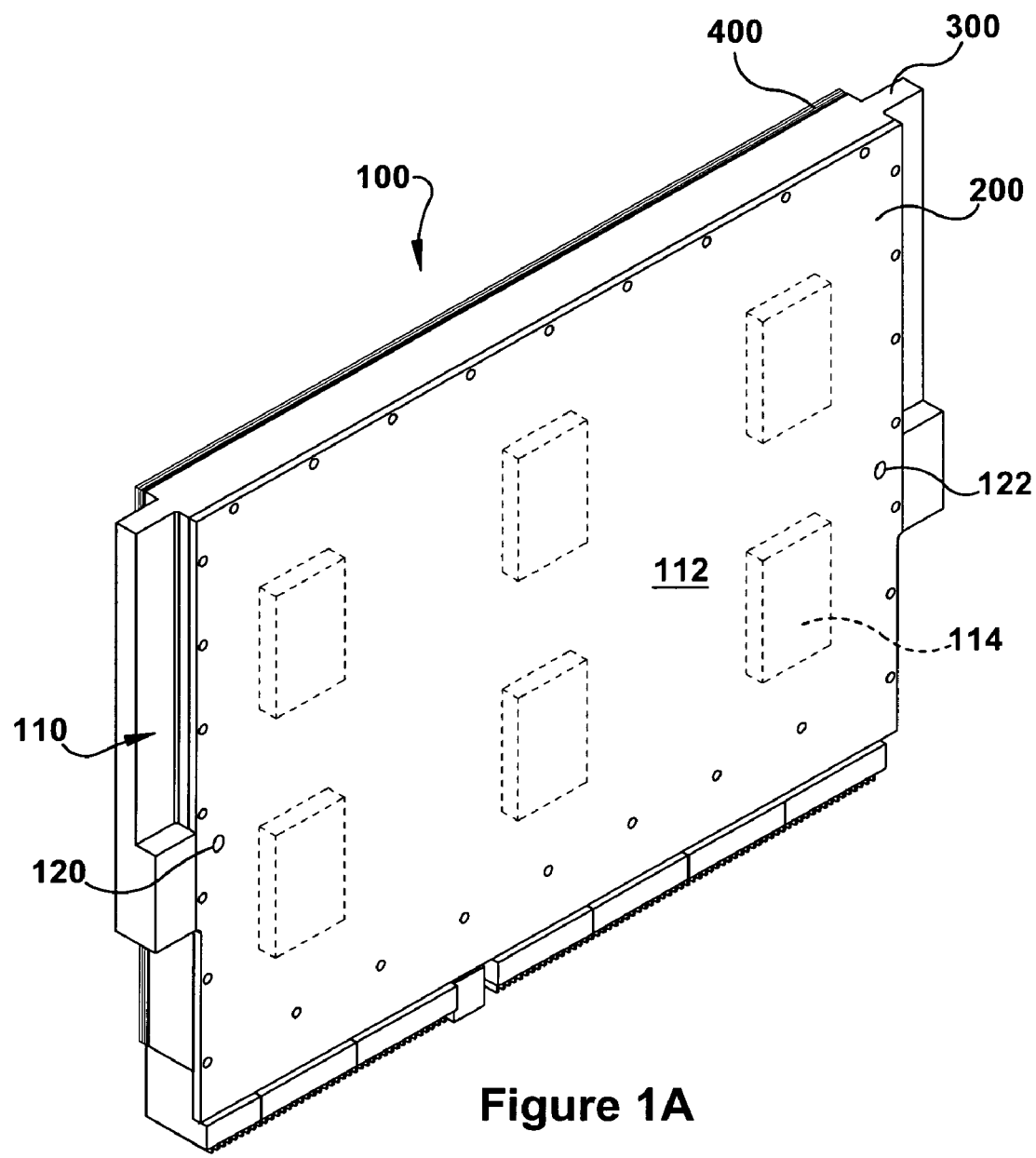
FIG. 1B is an exploded view of the enclosure 100.
Figure 1B:
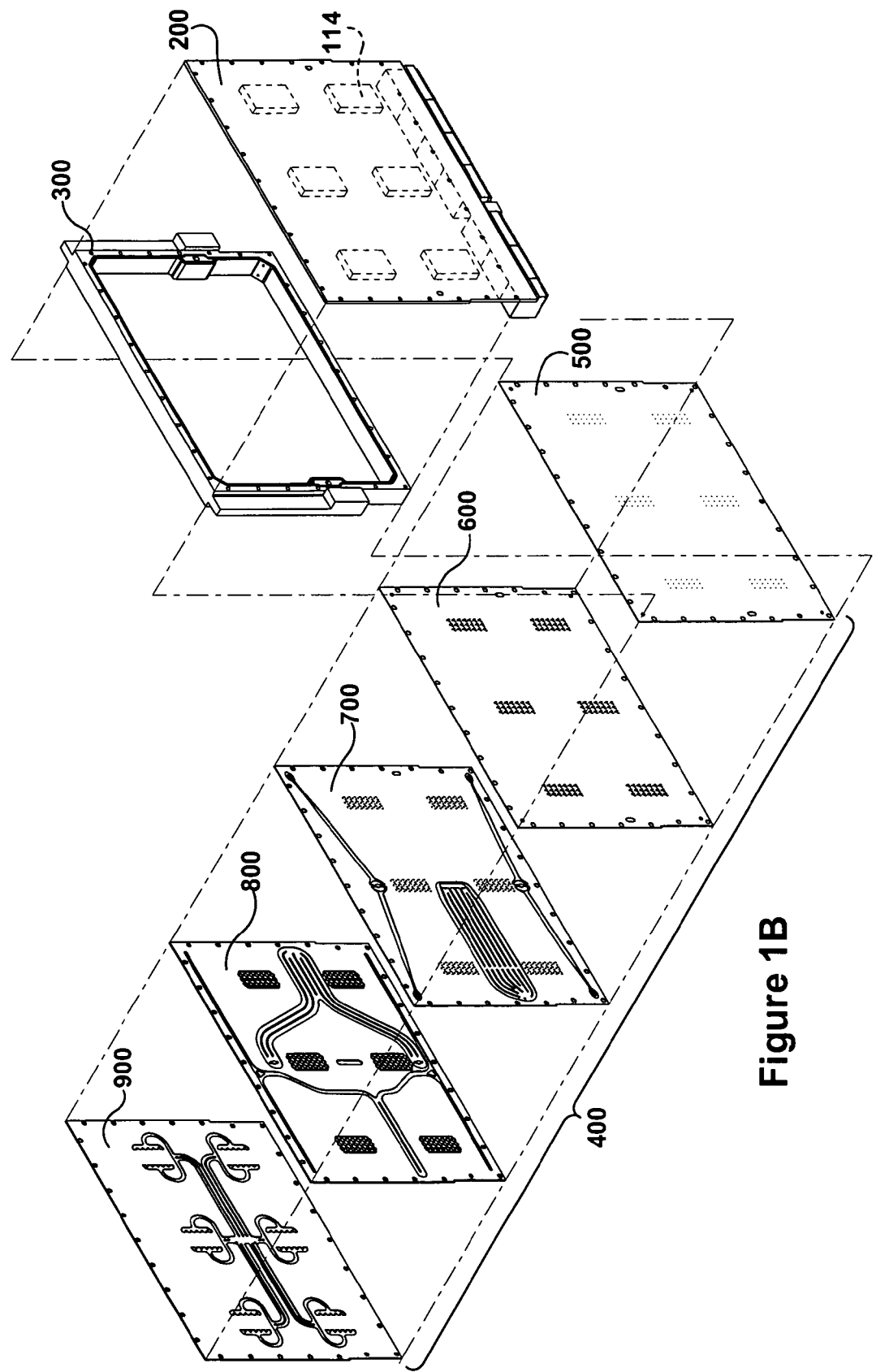

Referring now to the drawings, and initially to FIGS. 1A and 1B, an enclosure 100 is shown. The enclosure 100 comprises a wall structure 110 which defines a container space 112. In the illustrated embodiment, six electronic devices 114 are positioned within the container space 112 and they are arranged in three rows of two devices. However, more or less electronic devices 114 and/or a different arrangement of electronic devices 114 are certainly possible and contemplated. In fact, the devices 114 need not be electronic (or even present) as the enclosure 100 can be used in any situation wherein an operative fluid within the container space 112 needs to be removed therefrom.

The operative fluid can be any liquid or gas contained within the space 112. For example, in the illustrated embodiment, the operative fluid can be a heat-transfer fluid used to heat or cool the electronic devices 114. If the operative fluid is intended to cool the devices 114 (and/or the space 112) it could be, for example, water supplied in a manner consistent with a single-phase spray or two-phase spray (e.g., evaporative) cooling process. If the operative fluid is intended to heat the devices 114 (and/or the space 112) it could be, for example, heated air or steam. In certain situations, the container space 112 may simply be a holding cell for a fluid (e.g., fuel, oil, etc.) which will eventually need to be removed therefrom.

Figure 2A:
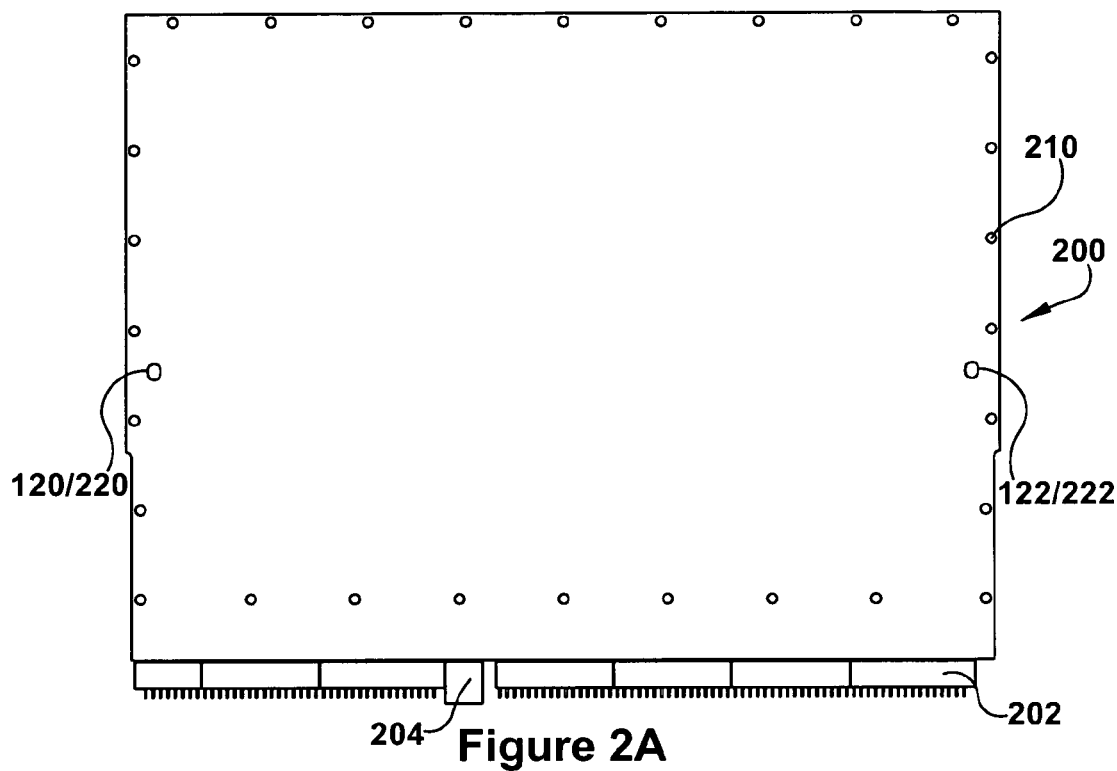
FIGS. 2A and 2B are views of the outer and inner surfaces, respectively, of the board 200.
Figure 2B:
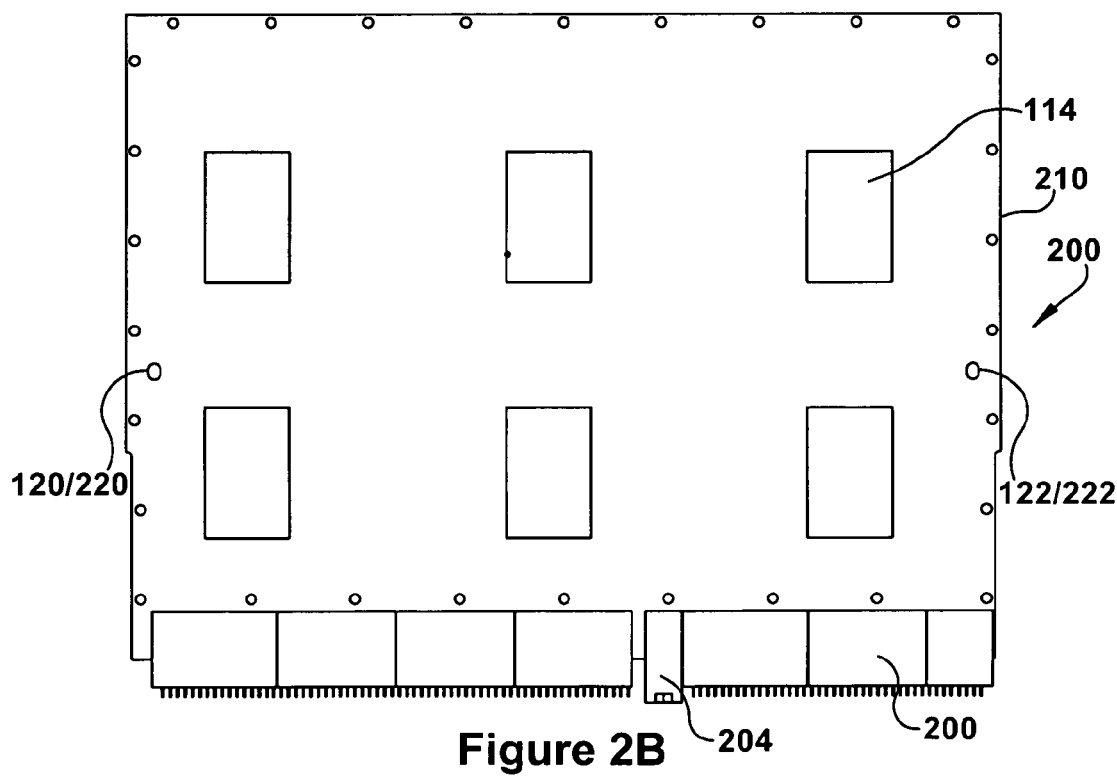
Figure 3A:
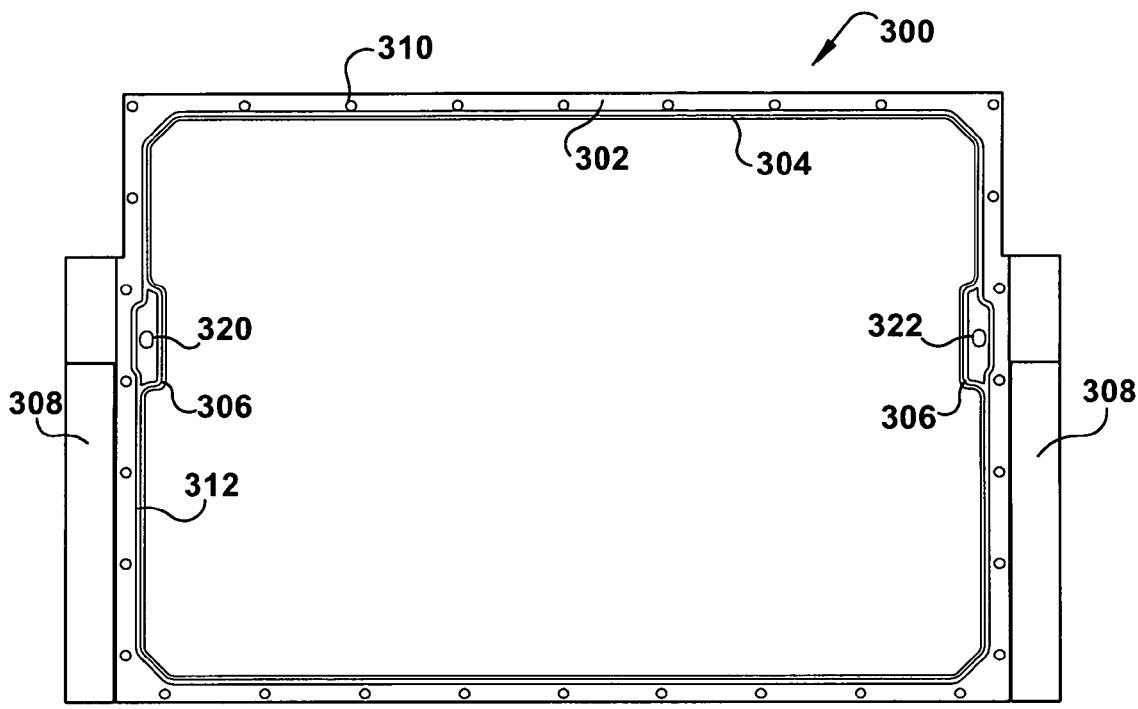
FIGS. 3A and 3B are views of the boardside and plateside surfaces, respectively, of the frame 300.
Figure 3B:
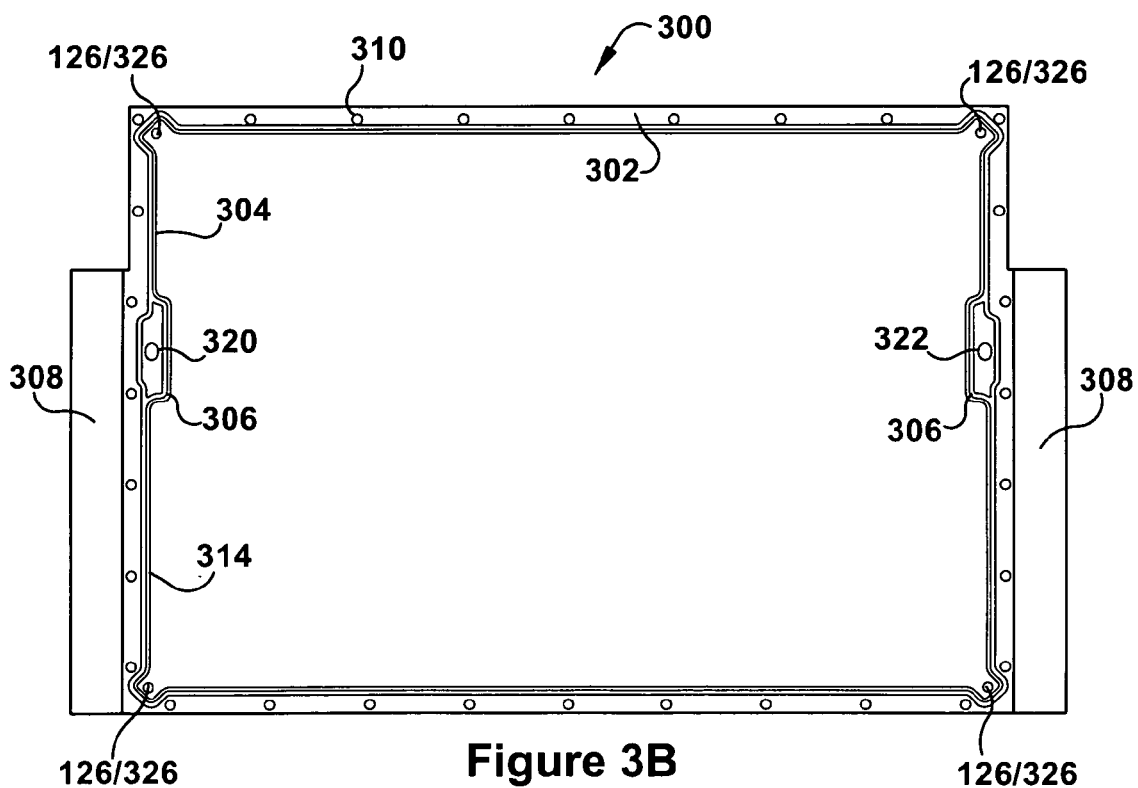

The illustrated wall structure 110 comprises a board 200, a frame 300, and a plate stack 400 (i.e., a stack of plates), which together define the container space 112. The board 200 is shown in more detail in the $2^{nd}$ series of drawings (FIGS. 2A-2B), the frame 300 is shown in more detail in the $3^{rd}$ series of drawings (FIGS. 3A-3B), and the stack 400 is shown in more detail in the $4^{th}$ series of drawings (FIGS. 4A-4C). As is shown in FIG. 4C, the stack 400 comprises plates 500, 600, 700, 800 and 900 which are positioned in face-to-face contact and joined together in a fluid tight manner. The plates 500, 600, 700, 800 and 900 are shown in more detail in the $5^{th}$ series of drawings (FIGS. 5A-5C), the $6^{th}$ series of drawings (FIGS. 6A-6C), the $7^{th}$ series of drawings (FIGS. 7A-7H), the $8^{th}$ series drawings (FIGS. 8A-8E), and the $9^{th}$ series of drawings (FIGS. 9A-9E), respectively.

Skipping now to FIG. 10A, the fluid map for the enclosure 100 is schematically shown. The enclosure 100 has an inlet 120, an outlet 122, an entrance 124, an exit 126, and an inducement chamber 128. When a motive fluid is introduced to the inducement chamber 128, it produces a differential pressure that induces operative fluid in the container space 112 to flow through the exit 126 to the inducement chamber 128. The motive fluid and the induced operative fluid then flow from the chamber 128 to the outlet 122.

An operative circuit 140 forms a flow path, for the operative fluid, from the inlet 120 through the entrance 124 to the container space 112 (so that it may be sprayed therein or otherwise supplied thereto) and then through the exit 126 to the inducement chamber 128. A motive fluid circuit 142 forms a flow path, for the motive fluid, from the inlet 120 to the inducement chamber 128. A drain circuit 144 forms a flow path, for the now-mixed operative fluid and motive fluid, from the inducement chamber 128 to the outlet 122.

When the fluid in the drain circuit 144 exits the enclosure 110 through the outlet 122, it can be returned back to the inlet 120 via a recirculation circuit 146. A pump 148 can be provided in the loop circuit 146 if necessary to encourage the flow of fluid therethrough. Additionally or alternatively, if the operative fluid is a heat-transfer fluid for heating or cooling the devices 114 within the container space 112 (or even just the container space 112 itself), a heat-exchanger 152 may be provided between the outlet 122 and the inlet 120 so that the operative fluid and/or the motive fluid is provided in an appropriate thermal condition. In fact, the heat-exchanger 152 can be employed whenever an outlet-to-inlet temperature adjustment is needed or desired.

In the flow map shown in FIG. 10A, the operative fluid and the motive fluid are supplied to the enclosure 100 through the same inlet 120. Thus the operative fluid circuit and the motive fluid circuit overlap (i.e., share the same flow passage) as they travel into the enclosure 100 through the inlet 120. In this case, the inlet 120 is considered both the inlet for operative fluid and the inlet for the motive fluid. However, as shown in FIGS. 10B and 10C, the operative fluid and the motive fluid can instead be supplied through two separate inlets 120a and 120b. With particular reference to FIG. 10C, the operative fluid and the motive fluid can be supplied from two different sources. The latter case could be used, for example, when the operative fluid and the motive fluid are two different fluids and/or they have different properties (temperature, pressure, etc.).

As is also shown in FIG. 10C, the drain fluid can be routed to a sink (or equipment) rather than being recycled to the enclosure 100. This flow path could be used, for example, when the drained fluid is fuel or oil being provided to a motor or a pump and/or when the operative fluid is not to re-enter the container space 112. Although not specifically shown in the drawings, a small percentage of the drain fluid (i.e., the supply fluid to the motor/pump) could be diverted to the inlet 120b for the motive fluid.

In the flow paths shown in FIGS. 10A-10C, the operative fluid circuit 140 is schematically shown as traveling through one entrance 124 into the container space 112 and then traveling through one exit 126 on route to the inducement chamber 128. However, the enclosure 100 can have a plurality of entrances 124 through which the operative fluid circuit 140 passes into container space 112. Multiple entrances 124 may be desirable to most efficiently provide the fluid to the devices 114, and/or regions of particular concern, within the container space 112. If an enclosure has a plurality of entrances 124, the operative fluid circuit 140 can split into separate flow passages downstream of the inlet 120/120a and upstream of the entrances 124. Alternatively, the enclosure 100 can be provided with a plurality of inlets 120/120a for the operative fluid and the circuit 140 can comprise a plurality of passages between the inlets 120 and respective entrances 124.

Figure 11A:
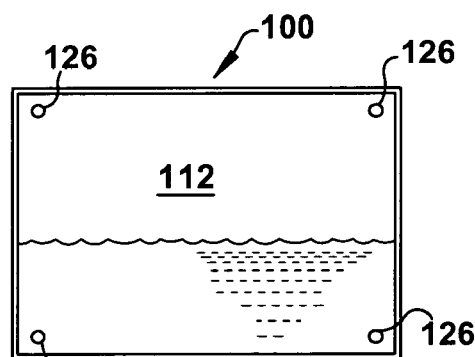
Figure 11B:
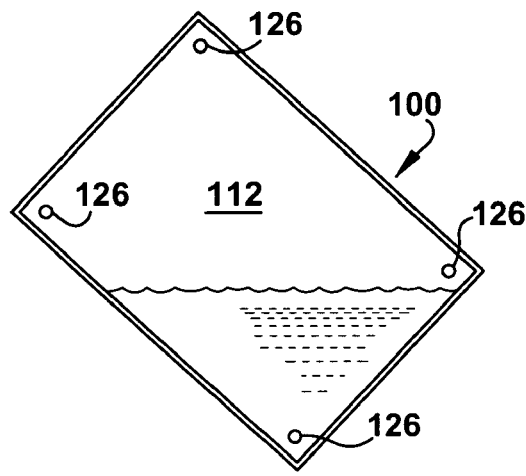
Figure 11C:
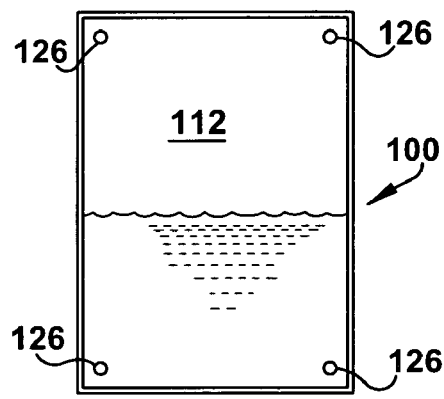
Figure 11D:
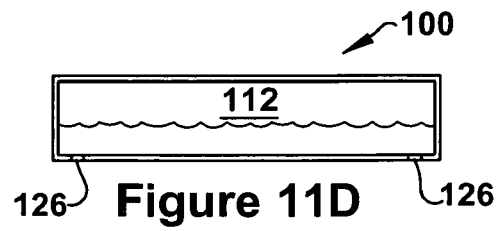

Additionally or alternatively, and as is shown schematically in FIGS. 11A-11D, the operative fluid circuit can have a plurality of exits 126. This plural-drain-exit design is particularly suited for situations where both liquid and vapor are contained with the space 112 and only the liquid is to be drained therefrom, especially if the enclosure 100 is likely to assume different orientations and/or experience different acceleration directions. The four exits 126 can be situated in different locations relative to the container space 112, so that at least one exit 126 will always be positioned to receive the liquid. If an inversion of the orientation shown in FIG. 11D is possible, a further set of exits 126 can be provided on the opposite wall to insure draining of liquid from the container space 112 when the enclosure 100 assumes such an inverted orientation.

In the illustrated embodiment, the exits 126 are positioned at each of the four corners of the rectangular-shaped enclosure 100. Other drain exit arrangements could likewise insure that at least one drain exit 126 will always be positioned to receive liquid operative fluid in any of the expected orientations of the enclosure 100. A good design starting point for selecting the location of the drain exits 126 can be obtained by aligning the origin of Cartesian coordinate graph with the approximate center of the container space 112, and then positioning an exit 126 near the most remote region (e.g., corner) of each quadrant/octant that corresponds to an expected orientation of the enclosure 100.

If the enclosure 100 has a plurality of exits 126, the operative fluid circuit 140 can form a flow path from each of these exits 126 to a single inducement chamber 128. Alternatively, the enclosure 100 can have a plurality of inducement chambers 128 and the operative fluid circuit 140 can form a flow path from one or more exits 126 to corresponding inducement chambers 128. In either or any event, a multi-chamber and/or multi-exit enclosure design may prove particularly advantageous in certain situations.

Particularly, for example, a multi-drain enclosure 100 (i.e., an enclosure having a plurality of exits 126) may be especially suited for use on vehicles (e.g., ships, submarines, aircraft, spacecraft, missiles, etc.) which experience a wide range of orientations, travel to elevated/submerged altitudes, and/or accelerate to high speeds. The enclosure 100 can be used, as illustrated, to house electronic devices 114 for these vehicles, but is certainly not limited to such electronic-housing applications. Instead, the enclosure 100 is a candidate for any application on such vehicles wherein a liquid fluid needs to be removed from the container space 112.

If the enclosure 100 has a multi-inducement chamber design (i.e., a plurality of inducement chambers 128), it is additionally or alternatively especially suited for situations where the container space 112 contains both liquid and gas, and only liquid is to be removed therefrom (e.g., oil sumps, fuel tanks, etc.). Specifically, the associated inducement chamber(s) 128 will preferentially remove liquid from immersed exit(s) 126, and any vapor removed by inducement chambers 128 associated the non-immersed exit(s) 126 will not cause cavitation, vapor-lock or other problems associated with conventional suction pumps. With the enclosure 100, this liquid-over-vapor removal can be accomplished without electrical doors, mechanical (e.g., float) valves, and/or crude "klunk" hoses.

Returning now to the $1^{st}$ through $9^{th}$ series of drawings, the board 200, the frame 300, the plate stack 400, and the plates 500, 600, 700, 800 and 900 can be described in more detail. For the purposes of the present description, when describing the board 200, the stack 400, and the plates 500-900, the modifier "inner" refers to the surface of the board/stack/plate which faces the container space 112 and the modifier "outer" refers to the surface which faces away from the container space 112. Regarding the frame 300, it does not really have an inner side and/or an outer side, but it can be viewed as having a surface facing the board 200 (its boardside surface) and an opposite surface facing the plate stack 400 (its plateside surface).

The illustrated board 200 has brick connectors 202 and an alignment pin 204 attached to an edge, which is its bottom edge in the illustrated orientation. The frame 300 comprises a rectangular border 302 having a thickness which essentially defines the thickness of the container space 112 and an interior perimeter 304 which defines the length/width of the container space 112. Tabs 306 are attached to the interior perimeter 304 and extension blocks 308 are attached to the border's exterior perimeter.

The board 200 and the frame 300 can be made of any suitable material such as, for example, metal, ceramic, glass and/or plastic. If the enclosure 100 is to be used with the electronic devices 114, dielectric materials and/or electrically-isolating coatings would probably be selected. Additionally or alternatively, if the operative fluid is a heat-transfer fluid being used for heating or cooling purposes, materials with a low thermal conductance, and/or insulating coverings could prove beneficial. The board/frame materials will usually be selected so as to not undesirably interact with the intended fluids and so as to not corrode from repeated contact with these fluids.

In the illustrated embodiment, mounting holes 210/310/410 in the board/frame/stack are aligned for receipt of a pin or other suitable fastener (not shown). The plates 500, 600, 700, 800 and 900 each have mounting holes 510, 610, 710, 810 and 910, respectively, which form the mounting holes 410 in the stack 400. The boardside surface of the frame 300 includes a recess 312 for a receipt of a similarly shaped gasket (not shown) to seal the seam between it and the inner surface of the board 200. Likewise, the plateside surface of the frame 300 has a gasket-receiving recess 314 to seal the seam between it and the inner surface of the stack 400 (and/or the inner surface of the plate 500). The recess 312 and the recess 314 encompasses certain openings (namely openings 320 and 322, introduced below) on the tabs 304 to isolate them from both the outside environment and the container space 112. The recess 314 detours around certain grooves (namely grooves 326 introduced below) so that they are in communication with the container space 112.

While the illustrated embodiment employs a certain technique for the assembly of the board 200, the frame 300, and the stack 400, they can, of course, be assembled by any appropriate manner which prevents leakage of fluid from the container space 112. Also, while in the illustrated embodiment the board 200, the frame 300, and the stack 400 are shown as three separate components, this is certainly not necessary. For example, one or more of these components could be formed in one piece (e.g., the board 200 and the frame 300, and/or the frame 300 and the stack 400) whereby no assembly between these components would be necessary.

In the illustrated embodiment, the electronic devices 114 are connected to the inner side of the board 200 thereby positioning them within the container space 112. However, such mounting is certainly not necessary as these devices 114 could be connected to a separate card and this card inserted into the container space 112. (See, e.g., substrate 160 in FIG. 15.) Also, as was indicated above, in certain circumstances, electronic devices 114 (or any other types of devices), may not even be present in the container space 112.

In the illustrated enclosure 100, the board 200, the frame 300, and the plates 500-900 have openings and/or grooves which form the inlet 120, the outlet 122, the entrance(s) 124, the exit(s) 126, the inducement chamber(s) 128 and the flow circuits 140/142/144. However, such a formation of these flow components is certainly not necessary in the construction of the enclosure 100. The openings (e.g., the inlet 120, the outlet 122, the entrance(s) 124, and/or the exit(s) 126), the inducement chamber(s) 128, and the flow circuits 140/142/144 could comprise, for example, tubing or piping inside, outside, and/or within the material matrix of the wall structure 110 of the enclosure 100.

For the purposes of the present description, the term "opening" refers to a hole which extends through the thickness of the board/frame/plate and the term "groove" refers to a recess which does not extend through its thickness. Thus, an opening would be visible on both the inner surface and the outer surface of the board/plate and on both the boardside surface and the plateside surface of the frame 300. A groove would only be visible on one of the inner/outer surfaces of the board/plate and would only be visible on one of the boardside/plateside surfaces of the frame 300.

Generally (but not necessarily), an opening will define a flow path in a direction non-parallel with (e.g., perpendicular to) the plane of the board/plate surface. A groove will sometimes be aligned with a groove and/or an opening on a contacting plate. Alternatively, a groove can be enclosed by the adjacent surface of a neighboring plate and define a flow path in a direction substantially parallel with the plane of the plate surface, usually between two or more openings. While in the illustrated embodiment the openings and grooves are positioned inward from the edges of the board 200, the frame 300, and the plates 500-900, some or all these features could extend to the edges if suitable in a specific situation or desired design.

It may be noted that for ease in explanation, and brevity in description, the openings, the grooves, and other features on a particular component each have a reference number corresponding to the hundred-column of the component's reference number. Also, as was implied above, the drawings are arranged in series corresponding to the hundred-column of the component's reference number. For example, features of the board 200 are referenced by 200+ numbers (e.g., 210, 220, 222, etc.) and shown in the $2^{nd}$ series of drawings, features of the frame 300 are referenced by 300+ numbers (e.g., 310, 320, 326, etc.) and shown in the $3^{rd}$ series of drawings, features of the stack 400 are referenced by 400+ numbers (e.g., 410, 420, 422, etc.) and shown in the $4^{th}$ series of drawings, features of the plate 500 are referenced by 500+ numbers (e.g., 510, 520, 522, etc.) and shown in the $5^{th}$ series of drawings, and so on.

The enclosure 100 has a single inlet 120 for both the operative fluid and the motive fluid and this inlet 120 is formed by an oval-shaped opening 220 on the board 200. As was indicated above, this inlet 120 could function solely as an inlet for the motive fluid with the operative fluid being otherwise introduced into the container space 112. The outlet 122 of the enclosure 100 is formed by another oval-shaped opening 222 on the board 200. During installation of the enclosure 100 in its intended application, appropriate plumbing could be provided to connect the inlet 120 to a source of fluid and to connect the outlet 122 to an appropriate drain. This plumbing can be connected to, or can be part of a recirculation loop circuit (see e.g., circuit 146 in FIGS. 10A and 10B), which recirculates fluid drained from the outlet 122 back to the inlet 120.

The entrances 124 through which the operative fluid enters the container space 112 are formed by circular openings 524 in the plate 500. The plate 500 forms the inner surface of the stack 400, whereby the openings 524 are the same as openings 424 in the stack 400. In the illustrated embodiment, there are six three-by-seven arrays of openings 524 (i.e., twenty-one openings 524 in each of the six arrays). The arrays are positioned so that one array is aligned with each of the six electronic devices 114 in the container space 112. Of course, the enclosure 100 can have any number of arrays, any arrangement of the arrays, and/or any number of openings in respective arrays. In a simple design, for example, the enclosure 100 could have only one entrance 124.

The exits 126 are formed by circular grooves 326 in the plateside surface of the frame 300 and/or circular openings 526 in the plate 500. Again, the inner surface of the plate 500 forms the inner surface of the stack 400, whereby the openings 526 are the same as openings 426 in the stack 400. In the illustrated embodiment, the four exit openings 126/426/526 are located one in each corner of the rectangular enclosure 100. In this manner, at least one exit opening 126 will always be positioned to receive liquid operative fluid from the container space 112, as was explained above in connection with FIGS. 11A-11D. That being said, more or less exits 126, and/or different exit patterns, are certainly possible and contemplated. In some circumstances it will be sufficient for the enclosure 100 to have a single exit 126.

The illustrated enclosure has four separate inducement chambers 128, one for each exit 126. Each inducement chamber 128 comprises a teardrop-shaped groove 728 and a teardrop-shaped rib 730 positioned within the groove 728. (FIG. 7C). The area 732 of the groove 728 outside of the rib 730 is the intake area for the operative fluid (on its return trip from the container space 112) and the area 734 within the rib 730 is the intake area for the motive fluid. The open necked ends of the teardrop-shaped groove 728 and the teardrop-shaped rib 730 empty into a discharge area 736 which translates into a drain groove (namely groove 780 introduced below).

The illustrated teardrop chamber geometry has been found to be effective in the producing the differential pressure necessary to induce the operative fluid within the container space 112 to flow to the chamber 128. That being said, the chamber 128 can be formed by any construction which results in the production of differential pressure sufficient to accomplish this inducement. Additionally or alternatively, one chamber 128 can be provided for more than one exit 126 and/or a plurality of chambers 128 can be provided for each exit 126.

The operative fluid circuit 140 begins at the inlet 120/220 and from there passes through openings 320, 520 (also 420) and 620, and into a relatively large groove 740 on the inner surface of the plate 700. The groove 740 has a pond-like shape with an intake area 742 (FIG. 7D) aligned with the opening 620 and a discharge area 744 (FIG. 7E) adjacent an oval opening 746. It may be noted for future reference that the intake area 742 of the groove 740 also includes an opening (namely opening 768, introduced below) which forms part of the motive fluid circuit 142.

The operative fluid passes through the opening 746 and an opening 846 into a groove 948 on the inner surface of the plate 900. The manifold-like groove 948 includes a central intake area 950 (FIG. 9C) aligned with the openings 746/846 and multiple discharge areas 952 (FIG. 9D) connected to the intake area 950 by channels/branches. The illustrated embodiment includes six pairs of discharge areas 952, each pair corresponding to, and aligned with, the six electronic devices 114. The discharge areas 952 each include six tentacles 954 (FIG. 9D) which correspond to the seven entrances 124 in each row of the seven-by-three arrays.

The operative fluid passes from each of the tentacles 954 through an opening 856 and into an aligned one of six distribution grooves 858 on the inner surface of the plate 800. Each distribution groove 858 has an island network 860 (FIG. 8C) positioned therein which causes the operative fluid to flow into three rows of seven annular channels 862 (FIG. 8D). The operative fluid flows from each annular channel 862 through three circumferentially-spaced openings 764 (FIGS. 7F and 7G) aligned with the annular shape of the corresponding channel 862. From each tri-group of openings 754, the operative fluid passes through a three-pronged pinwheel opening 666 (FIG. 6C). The pinwheel openings 666 each have an intake prong aligned with an opening 778 and central discharge area into which the prong-received fluid is swirled. From the central discharge area of each pinwheel opening 666, the operative fluid passes through the entrance openings 124/424/524 and into the container space 112.

As was indicated above, the six entrance-opening arrays are positioned so that one array is aligned with each of the six electronic devices 114 in the enclosure 100. In a simplified design, each of the three-by-seven arrays could be replaced with a single opening 124/424/524, with a corresponding replacement of the pinwheel openings 666, the tri-grouped openings 764, the annular channels 862, the grooves 858, the openings 856, and the discharge areas 952 of the groove 948. In an even simpler design, the enclosure 100 could have only one entrance opening 124/424/524, with corresponding changes being made upstream of this entrance opening. Alternatively, the entrance openings 124/424/524 could be arranged in a regular or irregular pattern relative to the container space 112, without any correlation to the arrangement (or presence) of the electronic devices 114.

Also in the illustrated embodiment, the portion of the operative fluid circuit 140 from the distribution groove 948 to the entrance openings 124/424/524 provides a spray-nozzle flow path resulting in the operative fluid entering the container space 112 in a conical spray. This introduction of the operative fluid may be beneficial when, for example, it is intended to provide single-phase spray or two-phase spray (e.g., evaporative) cooling to the container space 112. However, such a sprayed introduction of the operative fluid is not necessary and, in certain situations, may not be desirable. For example, a straight flow of the operative fluid into the container space 112 could be provided by the associated openings in the plates 900-800 having non-nozzle, non-swirling, and/or non-spraying shapes.

Moreover, the operative fluid need not be introduced to the container space 112 through the plate stack 400, and could instead be introduced through the board 200 and/or the frame 300. (See e.g., FIG. 11C.) If the operative fluid is not introduced through the plate stack 400, the plates 500-900 would not need have openings/grooves to form the entrance(s) 124 and the portions of the operative fluid circuit 140 upstream therefrom. Specifically, in the illustrated embodiment, the plates 500-900 would need not include the openings 524, the openings 624, the pond-like groove 740, the openings 746, the openings 846, the groove 948, the opening 856, the groove 858, and the openings 764 and 666.

Once the operative fluid is within the container space 112, it can perform its intended function or simply be stored therein. By way of an example, if the operative fluid is a heat-transfer fluid, it can heat or cool electronic devices 114 within the space 112, or even just the container space 112 itself. By way of another example, if the operative fluid is oil and/or fuel for a particular piece of equipment, the fluid can remain within the container space 112 until it is needed for operation of such equipment. In either or any event, the operative fluid exits the container space 112 through openings 126/426/526 and through an opening 626 into the intake area 732 surrounding the rib 730 in the inducement chamber 128/728.

In the illustrated embodiment, the motive fluid circuit 142 overlaps the operative fluid circuit, as it begins at the inlet 120/220 and from there passes through openings 320, 520 (also 420) and 620, and through the pond-shaped groove 740 on the inner surface of the plate 700. However, this circuit-overlap is certainly not necessary. The motive fluid circuit 142 could just as easily have its own inlet 120 and/or its own flow path to the groove 740. (See e.g., FIG. 10B.) In fact, the operative fluid circuit and the motive fluid circuit could remain completely separate until they are respectively introduced into the inducement chamber 128. (See, e.g., FIG. 10c.)

In any event, the illustrated motive fluid circuit 142 begins at the inlet 120/220, passes through openings 320, 520 (also 420) and 620, and into the pond-shaped groove 740. While most of the fluid in the groove 740 flows to and through the opening 746 as part of the illustrated operative fluid circuit 140, a small percentage of the fluid flows through an opening 768 (FIG. 7D). From the opening 768, the motive fluid travels into a groove 872 on the inner surface of the plate 800. The manifold-like groove 872 has an intake area 874 aligned with the opening 768, and four corner discharge areas 876 into which the intake area 874 branches/channels.

The motive fluid passes from the discharge areas 876 to the motive fluid intake area 732 (FIG. 7C) of the inducement chamber 128/728. As the motive flows from the intake area 732 through the necked open end of the rib 730, it accelerates to a high velocity thereby causing a pressure differential (e.g., a low pressure) in the discharge area 736. This pressure differential (e.g., vacuum) draws the operative fluid from the container space 112, through the nearest exit 126, through the downstream portion of the operative fluid circuit 140 to the intake area 732 of the inducement chamber 128/728, and then to its discharge area 736. Fluid mixing and momentum transfer in the discharge area 736 result in the operative fluid and the motive fluid thereafter traveling together through the drain circuit 144.

The drain circuit 144 comprises four grooves 780 in the inner surface of the plate 700 which extend from the discharge area 736 of each inducement chamber 128/728 to an opening 786 (FIG. 7F). The drain fluid (i.e., the combination of the operative fluid and the motive fluid leaving inducement chamber 128/728) flows through the openings 786 to a groove 888 on the inner surface of the plate 800. The groove 888 includes two intake areas 890 (FIG. 8E) which are aligned with adjacent pairs of the openings 786 and which channel into a common discharge area 892. The drain fluid flows from the area 892 through openings 822, 722, 622, 522 (also 422), and 322 to the outlet opening 122/222. Other drain circuit configurations are certainly possible with, and contemplated by, the present invention, as essentially any flow path between the inducement chamber 128 and the outlet 122 can constitute the drain circuit 144. Moreover, it is possible for the discharge area 736 of the inducement chamber 128/728 itself to serve as the outlet 122.

As is shown in the illustrated embodiment, various grooves can include ribs and/or islands to direct fluid flow and/or to preserve structural integrity (e.g., prevent the collapse of the channels/chambers created by such grooves). For example, ribs 794 and/or islands 796 (FIGS. 7A, 7D and 7E) can be provided in the pond-shaped groove 740 on the inner side of the plate 700. Ribs 894 and islands 896 can be provided in the groove 872, and ribs 894 (FIG. 8E) can be provided in the groove 888 on the inner side of the plate 800. Ribs 994 and islands 996 (FIGS. 9A and 9C) can be provided in the groove 948 on the inner side of the plate 900. The number, arrangement, and/or placement of the ribs and islands can, of course, be modified to accomplish the desired flow guidance and/or structural reinforcement. Moreover, in certain plate designs, ribs and/or islands may not be necessary at all.

The plates 500-900 can be made of any suitable material including, for example, metal materials, non-metal materials (e.g., ceramic) and/or polymer materials (e.g., plastic). They can be made of the same or different materials and can have the same or different thicknesses. Generally, at least some of the plates will be less than about ¼ inch thick. The openings/grooves can be formed on the plate material by any suitable method (e.g., etching, milling, laser, cutting, electric discharge, machining, water jetting and/or stamping). In some situations, it may be desirable to use different forming methods on different plates and/or different methods for forming different openings/grooves on the same plate. The plates 500-900 can be joined (usually after the formation of the openings/grooves) by any method resulting in fluid-tight seals between adjacent plates and/or around the openings/grooves in these plates. Possible joining methods include, for example, brazing, welding, diffusion-bonding, adhesives, and/or co-curing.

In the illustrated embodiment, the board 200 closes the boardside end of the frame 300 and the plate stack 400 closes its plateside end. As is shown schematically in FIG. 12A, the enclosure 100 could instead include a plate stack 400 on each side of the frame 300 (or other component formed separately or integrally with the stack(s) 400). Each plate stack 400 could define one or more exits 126 from the container space 112. (FIGS. 12B and 12C.) If each plate stack 400 includes, for example, four exits 126 with one positioned in the most remote region of each quadrant, the drain flow of the enclosure 100 would essentially be immune to gravity regardless of the orientation in which it is positioned and/or the acceleration directions to which it is subjected. This same result could, of course, be accomplished if one or both of the plate stacks 400 were replaced with other wall components with exits 126 arranged in a similar fashion.

If two plate stacks 400 are used, both plate stacks 400 could include the entrance(s) 124 to the container space 112 (FIG. 12B). In this case, both plate stacks 400 could also include the upstream portion of the operative fluid circuit 140 extending from the inlet 120 (and/or an inlet separate from the motive fluid inlet) to the entrance(s) 124. Alternatively, only one plate stack 400 could include the entrance(s) 124 and the exit(s) 126 (FIG. 12B), with the other plate stack 400 including only the exit(s) 126 (FIG. 12C). In this case, only one plate stack 400 would need to include the upstream-of-the-entrance portion of the operative fluid circuit 140. Also, as was implied above, each of the plate stacks 400 could include only the downstream-of-the-exits portion of the operative fluid circuit 140, with the operative fluid being introduced to the container space 112 by different means.

The electronic devices 114 could be attached to one or both plate stacks 400 (or other components carrying the flow circuits 140/142/144 and the inducement chambers 128). Alternatively, as shown schematically in FIG. 13, the electronic devices 114 could be attached to another substrate 160 and placed within the container space 112 prior to assembling the plate stacks 400 to the frame 300 (or other analogous component). The plate stacks 400 and/or other components can be permanently assembled (i.e., not intended to be reopened and/or reclosed) or, as is shown in FIGS. 14A and 14B, they can have a reopenable and/or recloseable connection (e.g., a lidded and/or a hinged connection) therebetween.

It may be noted that the enclosure 100 can be constructed to have a thin rectangular geometry resembling the shape of electronic-device-carrying substrates. As such, a plurality of the enclosures 100 can be compiled in a chassis 170 having a series of parallel slots/shelves 172 as this thin rectangular shape is compatible with conventional chassis structures. It may be noted that each enclosure 100 could have its own heating/cooling system designed to accommodate the electronic devices 114 contained therewithin. The enclosures 100 installed on the chassis 170 could share a common source of operative and/or motive fluid, and/or a common sink for drain fluid (if there is no recirculation). A common recirculation circuit 146 (and pump 148 and/or heat-exchanger 150) could also be shared by some or all of the enclosures 100 on the chassis 170, and could be incorporated into the chassis 170 itself. That being said, in other applications (e.g., oil sump, fuel tank) the enclosure 100 could adopt a different geometry, perhaps one reflecting a conventional sump/tank shape.

One may now appreciate that the enclosure 100 includes an inducement chamber 128 which, when fed by a motive fluid, drains an operative fluid from the container space 112. Depending on the intended use of the enclosure 100, it is can be constructed to provide many advantages in many different applications. Although the enclosure 100 and/or plate stack 400 has been shown and described with respect to certain preferred embodiments, it is apparent that equivalent and obvious alterations and modifications will occur to others skilled in the art upon the reading and understanding of this specification. The present invention includes all such alterations and modifications and is limited only by the scope of the following claims.

The invention claimed is:

1. An enclosure comprising a wall structure defining a container space and including:
   an entrance for an operative fluid into the container space;
   a plurality of exits for the operative fluid from the container space; and
   circuit(s) and/or chamber(s) that cause a motive fluid to produce a differential pressure that induces the operative fluid in the container space to flow through the plurality of exits to an outlet;
   wherein the wall structure further includes a motive fluid inlet for the motive fluid;
   wherein the circuit(s) and/or chamber(s) comprise:
      at least one inducement chamber associated with each of the plurality of exits;
      an operative fluid circuit forming a flow path from the container space through each of the plurality of exits to the associated inducement chamber(s); and
      a motive fluid circuit forming a flow path from the motive fluid inlet to each of the inducement chambers;
   wherein the inducement chambers cause the operative fluid to be induced to flow through the operative fluid circuit to the inducement chambers, and causes the operative fluid and the motive fluid to be induced to flow from the inducement chambers to the outlet.

2. An enclosure as set forth in claim 1, further comprising a drain circuit forming a flow path from the inducement chambers to the outlet.

3. An enclosure as set forth in claim 1, wherein the operative fluid circuit also forms a flow path from an operative fluid inlet for the operative fluid, to the entrance into the container space.

4. An enclosure as set forth in claim 1, wherein the plurality of exits are arranged so that at least one exit is positioned to receive a liquid portion of the operative fluid within the container space regardless of the orientation of the wall structure.

5. An enclosure as set forth in claim 4, wherein the wall structure includes a plurality of entrances into the container space, and wherein the operative fluid circuit forms a flow path from an inlet for the operative fluid to each of the plurality of entrances.

6. An enclosure as set forth in claim 5, wherein the operative fluid circuit includes flow passages shaped to introduce the operative fluid to the container space in a conical spray pattern.

7. An enclosure as set forth in claim 1, wherein the entrance, the plurality of exits, and the circuit(s) and/or chamber(s) are formed by openings and/or grooves in a plurality of plates, wherein the plates are in face-to-face contact and joined together in a fluid-tight manner to form a plate stack.

8. In combination, the enclosure set forth in claim 1;
   wherein the operative fluid is a heat-transfer fluid which heats and/or cools the container space;
   wherein the operative fluid and the motive fluid are supplied from the same source; and/or
   wherein a recirculation circuit recirculates fluid from the outlet back to the inlet for the motive fluid and/or an inlet for the operative fluid.

9. In combination, the enclosure set forth in claim 1 and one or more electronic devices, wherein the electronic devices are positioned within the container space.

10. An enclosure as set forth in claim 1, wherein the motive fluid circuit is fluidicly isolated from the operative fluid circuit within the container space.

* * * * *